United States Patent
Modi et al.

(10) Patent No.: US 10,284,182 B2
(45) Date of Patent: May 7, 2019

(54) DUTY CYCLE CORRECTION SCHEME FOR COMPLEMENTARY SIGNALS

(71) Applicant: SanDisk Technologies LLC, Plano, TX (US)

(72) Inventors: Primit Modi, Fremont, CA (US); Venkatesh Ramachandra, San Jose, CA (US); Tianyu Tang, Milpitas, CA (US); Srinivas Rajendra, Milpitas, CA (US)

(73) Assignee: SanDisk Technologies LLC, Plano, TX (US)

(*) Notice: Subject to any disclaimer, the term of this patent is extended or adjusted under 35 U.S.C. 154(b) by 0 days.

(21) Appl. No.: 15/639,153

(22) Filed: Jun. 30, 2017

(65) Prior Publication Data

US 2018/0175834 A1  Jun. 21, 2018

Related U.S. Application Data

(60) Provisional application No. 62/436,429, filed on Dec. 20, 2016.

(51) Int. Cl.
| | |
|---|---|
| *H03K 3/017* | (2006.01) |
| *H03K 5/156* | (2006.01) |
| *H03K 5/151* | (2006.01) |
| *H03K 7/08* | (2006.01) |
| *G11C 7/22* | (2006.01) |
| *G11C 29/02* | (2006.01) |

(Continued)

(52) U.S. Cl.
CPC ............ *H03K 3/017* (2013.01); *G11C 7/222* (2013.01); *G11C 29/023* (2013.01); *G11C 29/028* (2013.01); *H03K 5/151* (2013.01); *H03K 5/1565* (2013.01); *H03K 7/08* (2013.01); *G11C 7/04* (2013.01); *G11C 7/1066* (2013.01); *G11C 7/1093* (2013.01)

(58) Field of Classification Search
CPC ...... G11C 7/222; H03K 3/017; H03K 5/1565; H03K 7/08
USPC .......................................................... 327/175
See application file for complete search history.

(56) References Cited

U.S. PATENT DOCUMENTS

| | | | | |
|---|---|---|---|---|
| 5,572,158 A | * | 11/1996 | Lee .................. | H03K 5/086 327/170 |
| 6,169,434 B1 | * | 1/2001 | Portmann ............ | H03K 5/1565 327/175 |

(Continued)

OTHER PUBLICATIONS

International Search Report and Written Opinion dated Dec. 1, 2017 for corresponding application No. PCT/US2017/050649.

(Continued)

*Primary Examiner* — William Hernandez
(74) *Attorney, Agent, or Firm* — Brinks, Gilson & Lione

(57) ABSTRACT

A complementary signal path may include an amplifier circuit configured to receive a pair of complementary input signals and a data alignment circuit configured to output a pair of complementary output signals in response to the pair of complementary input signals. A control circuit may detect duty cycle distortion in the pair of complementary output signals and perform a duty cycle correction process to remove the distortion. To do so, the control circuit may search for target current amounts in response to the duty cycle distortion and inject a control current into the amplifier circuit at the target current amounts.

21 Claims, 7 Drawing Sheets

(51) Int. Cl.
   *G11C 7/04*     (2006.01)
   *G11C 7/10*     (2006.01)

(56) References Cited

U.S. PATENT DOCUMENTS

| | | |
|---|---|---|
| 6,798,248 B2 | 9/2004 | Hazucha et al. |
| 9,275,706 B2 | 3/2016 | Tam |
| 2005/0122149 A1* | 6/2005 | Cho .................. H03K 5/135 327/175 |
| 2007/0086267 A1 | 4/2007 | Kwak |
| 2007/0258546 A1* | 11/2007 | Smeloy ............ H03F 3/45623 375/318 |
| 2010/0301913 A1* | 12/2010 | Li ........................ G06F 1/04 327/175 |
| 2012/0086488 A1 | 4/2012 | Willey |
| 2013/0249612 A1 | 9/2013 | Zerbe et al. |
| 2014/0084936 A1 | 3/2014 | Pan et al. |
| 2016/0191059 A1 | 6/2016 | Mathur et al. |

OTHER PUBLICATIONS

U.S. Appl. No. 15/188,669, filed Jun. 21, 2016; 35 pages.
U.S. Appl. No. 15/226,574, filed Aug. 8, 2016; 72 pages.

\* cited by examiner

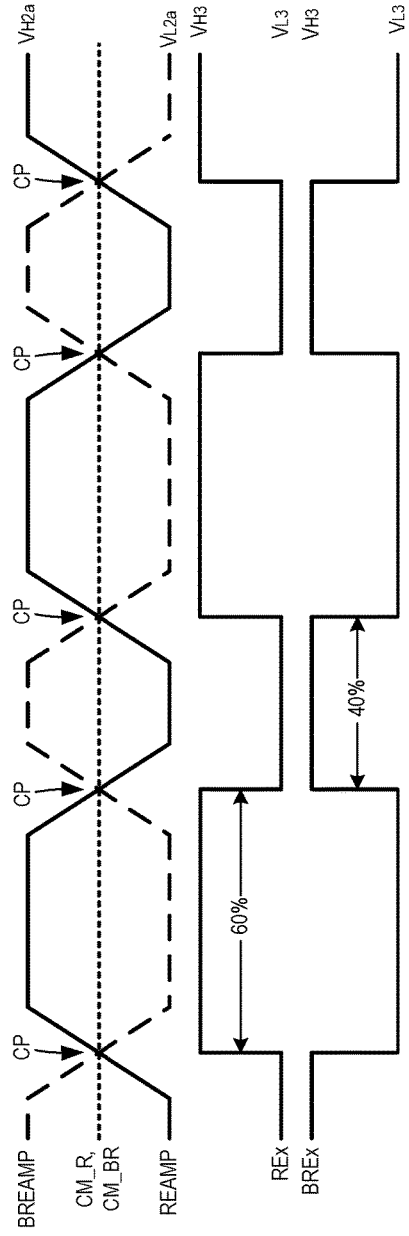
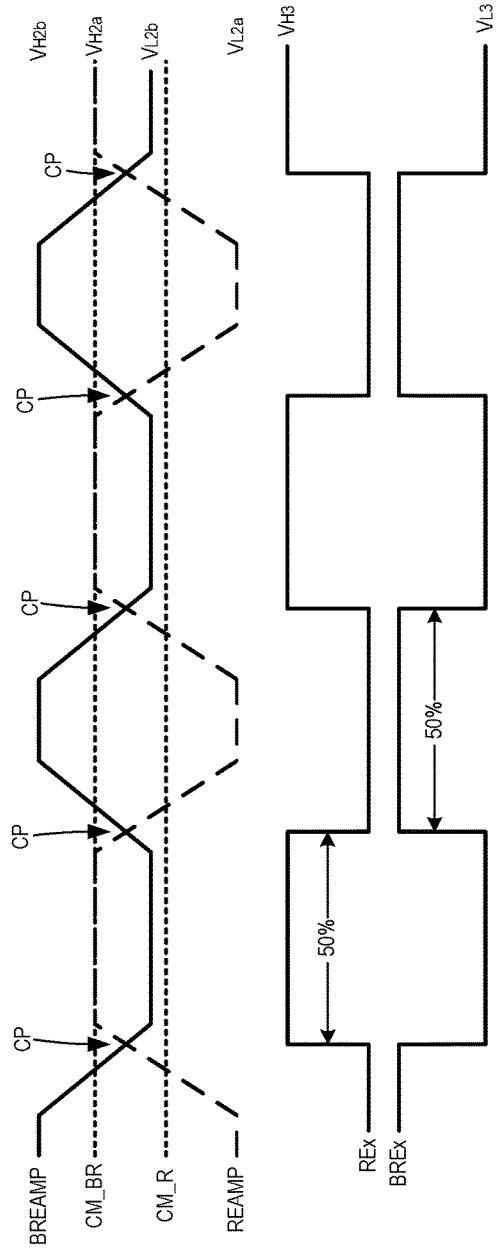
FIG. 3A  FIG. 3B  FIG. 3C  FIG. 3D  FIG. 3E

DUTY CYCLE CORRECTION SCHEME FOR COMPLEMENTARY SIGNALS

CROSS-REFERENCE TO RELATED APPLICATIONS

This application claims the benefit of U.S. Provisional Application No. 62/436,429, filed Dec. 20, 2016. The contents of U.S. Provisional Application No. 62/436,429 are incorporated by reference in their entirety.

BACKGROUND

In memory applications, a storage device may include a controller that sends a complementary pair of clock signals to a memory die in order to read data from the memory die. In response to the clock signals, the memory die may align data pulses of data signals to the edges of the clock signals and send the aligned data signals along with clocks signals back to the controller. The controller may then process the data signals using the clock signals.

Typically, the clocks signals have a 50% duty cycle. In an ideal situation, the controller generates the clock signals with the 50% duty cycle, and the duty cycle remains at 50% throughout the read process. That is, the memory die retrieving the data for the controller receives the clock signals with the 50% duty cycle, maintains the duty cycle at 50% while aligning the data, and transmits the clocks signals with a 50% duty cycle back to the controller.

However, in actual implementation, due to process-voltage-temperature (PVT) variations, the controller may not generate the clock signals with a 50% duty cycle and/or the duty cycle of clocks signals may shift away from the 50% duty cycle when the memory die aligns the data with the clock signals. Consequently, when the controller receives the data signals and the clock signals from the memory die, the controller may make errors in latching the data. For example, if the clock signals and the data signals are not properly aligned, the controller may miss sampling certain data pulses while sampling others twice. In addition or alternatively, if the duty cycle is sufficiently far from 50%, the controller's resistor-capacitor (RC) components may filter out or attenuate the edges of the clock signals. In turn, the controller may miss sampling certain data pulses because it failed to recognize a clock edge as occurring. In view of the errors that can result when the clock signals are generated away from 50% and/or when the duty cycle shifts away from 50% during data retrieval processes, duty cycle correction schemes that correct the duty cycle and move the duty cycle back to 50% are desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

FIG. 3A is a timing diagram of example waveforms of a pair of complementary input signals with distorted duty cycles.

FIG. 3B is a timing diagram of example waveforms of a first pair of complementary input signals generated in response to the pair of complementary input signals of FIG. 3A without current injection.

FIG. 3C is a timing diagram of example waveforms of a second pair of complementary input signals generated in response to the first pair of complementary intermediate signals of FIG. 3B without current injection.

FIG. 3D is a timing diagram of example waveforms of a first pair of complementary input signals generated in response to the pair of complementary input signals of FIG. 3A with current injection.

FIG. 3E is a timing diagram of example waveforms of a second pair of complementary input signals generated in response to the first pair of complementary intermediate signals of FIG. 3D with current injection.

DETAILED DESCRIPTION

Overview

Figure 1:
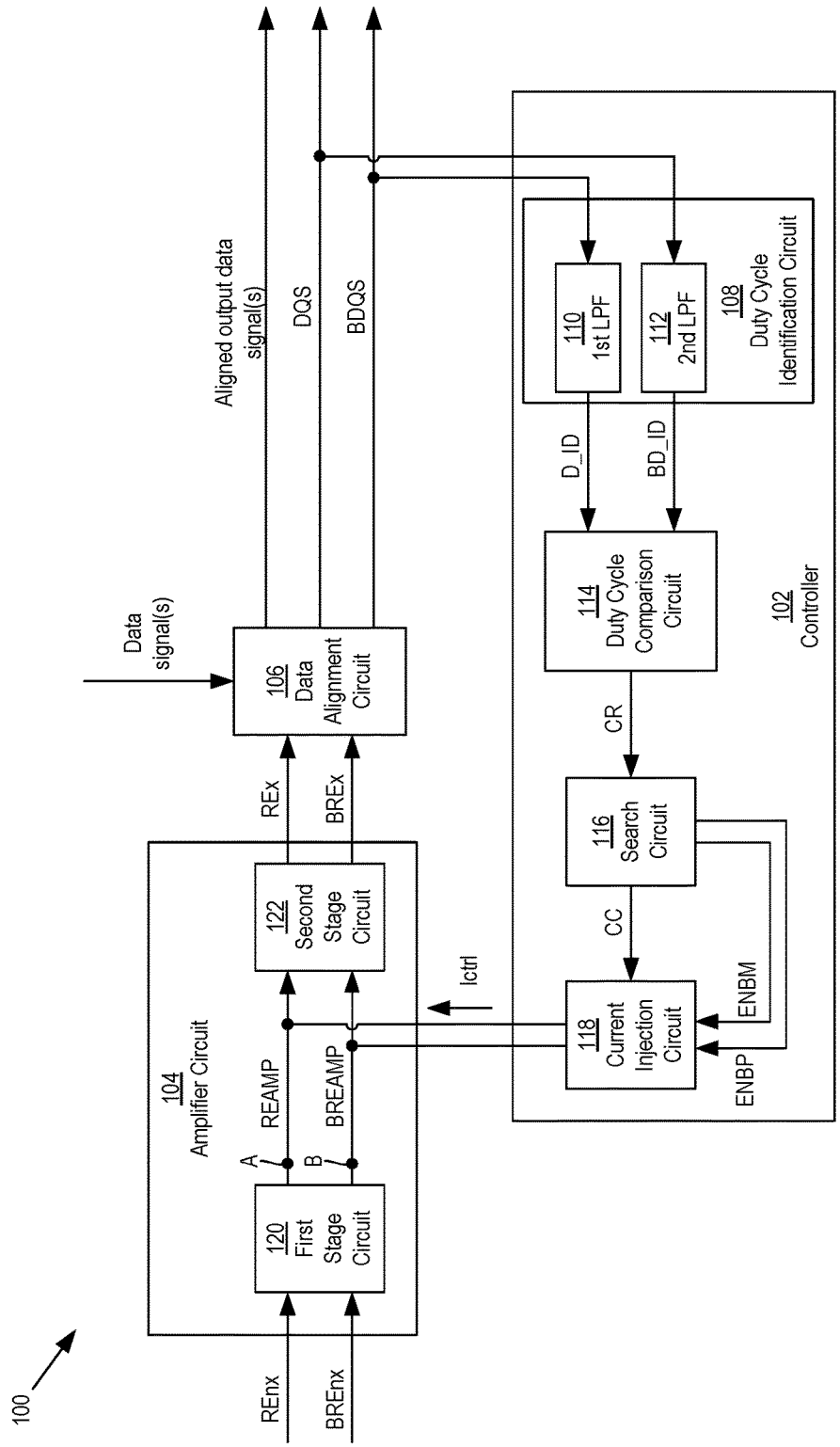
FIG. 1 is a block diagram of an example duty cycle correction circuit.

The present description describes apparatus, devices, systems, circuits, and methods that include a duty cycle correction circuit configured to perform a duty cycle correction process. In one embodiment, a circuit includes: a complementary signal path circuit configured to receive a pair of complementary input signals and generate a pair of complementary output signals in response to receipt of the pair of complementary input signals. The complementary signal path circuit includes an amplifier circuit and a control circuit. The amplifier circuit is configured to receive a pair of complementary input signals and generate at least one pair of complementary intermediate signals in response to receipt of the pair of complementary input signals. The control circuit is configured to: measure a duty cycle mismatch between the pair of complementary output signals, and set at least one of a gain of the amplifier circuit or a common mode voltage of the at least one pair of complementary intermediate signals based on the measured duty cycle mismatch.

In some embodiments, the control circuit is further configured to inject a control current into the amplifier circuit based on the duty cycle mismatch to set at least one of the gain or the common mode voltage.

In some embodiments, the at least one pair of complementary intermediate signals includes a first pair of complementary intermediate signals and a second pair of complementary intermediate signals. In addition, the amplifier circuit includes a first stage circuit configured to generate the first pair of complementary intermediate signals and a second stage circuit configured to generate the second pair of complementary intermediate signals. Also, the control circuit is configured to select one of a first output node and a second output node of the first stage circuit into which to inject the control current.

In some embodiments, the control circuit is further configured to determine target current amounts at which to inject the control current over an N-number of iterations, and inject the control current at the determined target current amounts into the selected one of the first and second output nodes during the N-number of iterations.

In some embodiments, each of the complementary output signals includes a respective duty cycle. The control circuit is further configured to select the one of the first and second output nodes into which to inject the control current in response to an identification of which of the duty cycles of the pair of complementary output signals is higher.

In some embodiments, the first stage circuit includes a first branch configured to generate a first signal of the first pair of complementary intermediate signals, and a second branch configured to generate a second signal of the first pair of complementary intermediate signals. The first branch is connected to the first output node and the second branch is connected to the second output node. Also, the control circuit is configured to inject the control current into the selected one of the first and second output nodes to cause the first branch to generate the first signal with reduced gain and an increased common mode voltage or to cause the second branch to generate the second signal with reduced gain and an increased common mode voltage.

In some embodiments, the second stage circuit is configured to detect cross-points of the first pair of complementary intermediate signals in order to generate the second pair of complementary intermediate signals; adjust duty cycles of the second pair of complementary intermediate signals in response to a change in the cross-points corresponding to the injection of the control current; and output the second pair of complementary intermediate signals with the adjusted duty cycles to a data alignment circuit of the complementary signal path.

In some embodiments, the control circuit includes: a differential amplifier configured to: in a first duty cycle comparison phase: receive, at a first input terminal, a first voltage level indicative of a duty cycle of a first signal of the pair of complementary output signals; generate an output voltage at a first output voltage level corresponding to the first voltage level; and feed back the output voltage at the first output voltage level to a second input terminal. Additionally, in a second duty cycle comparison phase, the differential amplifier is configured to: receive, at the first input terminal, a second voltage level indicative of a duty cycle of a second signal of the pair of complementary output signals; and generate the output voltage at a second output voltage level indicative of a difference between the first voltage level of the first duty cycle identification signal and the second voltage level of the second duty cycle identification signal.

In another embodiment, a circuit includes: an amplifier circuit configured to output an amplifier output signal in response to receipt of an input signal; a target current amount for a control current; and a current injection circuit configured to inject the control current at the target current amount into the amplifier circuit. The amplifier circuit is configured to adjust a duty cycle of the amplifier output signal in response to receipt of the control current at the target current amount.

In some embodiments, the search circuit is configured to select the target current amount from an array of possible target current amounts for the control current.

In some embodiments, the current injection circuit includes a plurality of current source circuits. Each of the current source circuits is configured to output a respective one of a plurality of currents for generation of the control current. The possible target current amounts in the array are represented by n-bit binary values. In addition, the search circuit is configured to identify a combination of the current source circuits to be activated corresponding to logic levels of bits of the n-bit binary values.

In some embodiments, a data alignment circuit is configured to output a pair of complementary output signals in response to receipt of the amplifier output signal. Each of the complementary output signals has a respective duty cycle, and the search circuit is configured to search for the target current amount based on which of the duty cycles of the complementary output signals is higher.

In some embodiments, the search circuit is configured to search for a plurality of target current amounts over a plurality of iterations of a duty cycle correction process, and wherein the search circuit is configured to set either a new maximum target current amount or a new minimum target current amount during each of the iterations in order to search for the plurality of target current amounts.

In some embodiments, the search circuit is configured to execute a search algorithm to search for the target current amount.

In some embodiments, the search algorithm is a binary search algorithm.

In another embodiment, a system an amplifier circuit, a data alignment circuit, and a feedback circuit. The amplifier circuit is configured to generate at least one pair of clock signals. The data alignment circuit is configured to generate an aligned data signal and a pair of output clock signals based on the at least one pair of clock signals. The feedback circuit is configured to determine duty cycle distortion in the pair of output clock signals; and in response to the determination, control the amplifier circuit to adjust at least one characteristic of the at least one pair of clock signals to compensate for the duty cycle distortion.

In some embodiments, the feedback circuit is configured to output current to the amplifier circuit to cause the amplifier circuit to adjust the at least one characteristic.

In some embodiments, the feedback circuit is configured to control the amplifier circuit to adjust cross-points of the at least one pair of clock signals.

In some embodiments, the feedback circuit is configured to control the amplifier circuit to move duty cycles of the pair of output clock signals closer to a predetermined duty cycle.

In some embodiments, a duty cycle comparison circuit is configured to: in a first duty cycle comparison phase: receive, at a first input terminal, a first voltage level indicative of a duty cycle of a first output clock signal of the pair of output clock signals; generate an output voltage at a first output voltage level corresponding to the first voltage level;

and feed back the output voltage at the first output voltage level to a second input terminal. Additionally, in a second duty cycle comparison phase, the duty cycle comparison circuit is configured to: receive, at the first input terminal, a second voltage level indicative of a duty cycle of a second output clock signal of the pair of output clock signal; and generate the output voltage at a second output level indicative of a difference between the duty cycle of the first output clock signal and the duty cycle of the second output clock signal.

In another embodiment, a system includes an amplifier circuit, a data alignment circuit, and a control circuit. The amplifier circuit includes a first branch and a second branch. The first branch is configured to receive a first input signal of a pair of input signals; and output a first intermediate signal of a pair of intermediate signals. The second branch is configured to receive a second input signal of the pair of input signals; and output a second intermediate signal of the pair of intermediate signals. The data alignment circuit is configured to generate a pair of output signals based on the pair of intermediate signals. The control circuit is configured to: measure a duty cycle mismatch between the pair of output signals; and based on the measured duty cycle mismatch, inject a control current into: the first branch to generate the first signal of the pair of intermediate signals with reduced gain and an increased common mode voltage; or the second branch to generate the second signal of the pair of intermediate signals with reduced gain and an increased common mode voltage.

Other embodiments are possible, and each of the embodiments can be used alone or together in combination. Accordingly, various embodiments will now be described with reference to the attached drawings.

Embodiments

FIG. 1 is a block diagram of an example duty cycle correction circuit system 100 that is configured to correct duty cycle distortion in a pair of complementary signals. As used herein, two signals of a pair are complementary in that when one of the signals is at an associated high level the other is at an associated low level. The waveforms of two complementary signals are considered to inversely track each other in that when one signals performs a rising transition, the other signal performs a falling transition. In addition or alternatively, two signals that are complementary are 180-degrees out of phase with each other or have waveforms representative of two signals that are 180-degrees out of phase with each other.

Also, as used herein, a level of a signal at a given point in time is a magnitude value, such as a voltage magnitude value or a current magnitude value. In general, a high level and a low level are both magnitude values where the high level is higher in magnitude than the low level. A high level of a signal may be a single high level, a level that is within a set or range of high levels, a maximum high level or a minimum high level of a set or range of high levels, or an average high level of a set or range of high levels. Similarly, a low level of a signal may be a single low level, a level that is within a set or range of low levels, a maximum low level or a minimum low level of a set or range of low levels, or an average low level of a set or range of low levels.

In addition or alternatively, a given signal may transition between a high level and a low level according to a swing requirement that sets or identifies a minimum high level and a maximum low level. A signal that transitions according to the swing requirement may transition to a high level that is at or above the minimum high level of the swing requirement, and may transition to a low level that is at or below the maximum low level of the swing requirement.

In addition or alternatively, for a given voltage that is applied to a gate terminal of a p-channel metal-oxide-semiconductor field-effect transistor (PMOS transistor), the high level of the given voltage is a level that turns off or is capable of turning off the PMOS transistor, and the low level of the given voltage is a level that turns on or is capable of turning on the PMOS transistor. Similarly, for a given voltage that is applied to a gate terminal of an n-channel metal-oxide-semiconductor field-effect transistor (NMOS transistor), the high level of the given voltage is a level that turns on or is capable of turning on the NMOS transistor, and the low level of the given voltage is a level that turns off or is capable of turning off the NMOS transistor.

In addition, a signal may perform a rising transition when the signal transitions from its low level to its high level, and may perform a falling transition when the signal transitions from its high level to its low level. For a pair of complementary signals, when a first signal of the pair is performing a rising transition, a second signal of the pair is performing a falling transition, or in the event that the rising and falling transitions are not occurring concurrently, then the transition of the second signal that is occurring closest in time to the rising transition of the first signal is a falling transition. Similarly, when the first signal of the pair is performing a falling transition, the second signal is performing a rising transition, or in the event that the rising and falling transitions are not occurring concurrently, then the transition of the second signal that is occurring closest in time to the falling transition of the first signal is a rising transition. A rising edge of a signal's waveform denotes a rising transition, and a falling edge of a signal's waveform denotes a falling transition.

In addition, each signal may include pulses that are formed or defined by the rising and falling transitions of the signal. In particular example configurations, the pulses of a signal may correspond to the high level of a signal, in that each pulse is defined by a rising transition followed by a period where the signal is maintained at its high level, and then followed by a falling transition.

Additionally, a pair of complementary signals may perform their respective rising and falling transitions according to an associated frequency or rate. The pulses of the signals may occur according to the frequency of the signal. Each period or cycle of the signals may include a first portion and a second portion. During the first portion, a first signal of the pair is at the high level and a second signal of the pair is at the low level. During the second portion, the first signal is at the low level and the second signal is at the high level. In addition, each signal of the pair may have an associated duty cycle. As used herein, a duty cycle of a signal is the percentage or fraction of one period that the signal is at its high level. In addition or alternatively, the duty cycle of a signal is the ratio of a pulse width of a pulse in a single period of the signal to a total duration of the period.

Also, in at least some example configurations, a pair of complementary signals is a pair of clock signals. A clock signal has repetitive cycles. Within each period, the first portion occurs first in time and the second portion occurs second in time—i.e., after the first portion. After the second portion of one cycle occurs, the first portion of a next cycle occurs. As clock signals, the rising and falling edges of the signals may be used for timing purposes, such as for temporarily aligning data pulses of data signals and/or for indicating when to sample or otherwise identify levels of the data pulses, as described in further detail below.

Referring particularly to FIG. 1, the duty cycle correction circuit 100 may include a controller or control circuit 102 and an amplifier circuit 104. The duty cycle correction circuit 100 may further include, or alternatively be in communication with, a data alignment circuit 106. The data alignment circuit 106 may be configured to receive one or more data signals and output one or more aligned output data signals that correspond to the one or more data signals it receives. A data signal may include a series of data pulses, with each data pulse corresponding to a bit of a bit sequence. The level, such as a voltage level, of each data pulse, may correspond to and/or indicate a single bit logic value, such as a logic 1 value or a logic 0 value. Accordingly, each data pulse of the data signal may indicate whether a corresponding bit of the bit sequence represented by the data signal has a logic 1 value or a logic 0 value. Other configurations, such as those where the levels of the data pulses indicate multi-bit logic values, may be possible.

The amplifier circuit 104 may be configured to receive a pair of complementary input signals REnx, BREnx, and in response, generate pairs of intermediate complementary signals, including a first pair of complementary intermediate signals REAMP, BREAMP and a second pair of complementary intermediate signals REx, BREx. The data alignment circuit 106 may be configured to receive the second pair of complementary intermediate signals REx, BREx, and in response, generate and output a pair of complementary output signals DQS, BDQS. In this context, the amplifier circuit 104 and the data alignment circuit 106 may form a complementary signal path circuit extending from the input of the amplifier circuit 104 to the output of the data alignment circuit 106. As a whole, the complementary signal path circuit is configured to receive the pair of complementary input signals REnx, BREnx, and generate the pair of complementary output signals DQS, BDQS in response to receipt of the pair of complementary input signals REnx, BREnx. In the complementary signal path, the amplifier circuit 104 generates the two pairs of intermediate signals REAMP/BREAMP, and REx, BREx, and the data alignment circuit 106 aligns the data signal(s) with the second pair of intermediate signals REx, BREx, and outputs the output signals DQS, BDQS in response to the alignment process. The second pair of complementary output signals REx, BREx may be referred to as the amplifier output signals of the amplifier circuit 104.

The data alignment circuit 106 may be configured to generate and output the pair of complementary output signals DQS, BDQS each with a respective target or predetermined duty cycle or a duty cycle that is within an acceptable range of duty cycles. The acceptable range may include and/or be centered around the predetermined duty cycle. For example, the acceptable range may be a set of duty cycles defined by the predetermined duty cycle plus-or-minus a predetermined error amount or plus-or-minus a certain percentage of the predetermined duty cycle. A duty cycle that is away from the predetermined duty cycle and/or outside of the acceptable range of duty cycles is referred to as a distorted duty cycle. Conversely, a duty cycle that is at the predetermined duty cycle or within the acceptable range of duty cycles is referred to as an undistorted duty cycle. For a given signal, an amount of duty cycle distortion of the signal is a difference between an actual duty cycle of the signal and the predetermined duty cycle.

Additionally, two complementary signals of a pair may have an amount of duty cycle mismatch, which is the difference between a duty cycle of one signal and the duty cycle of the other. A pair of complementary signals may have a target or predetermined amount of duty cycle mismatch. Where the duty cycles of the two complementary signals are the same, then the amount of duty cycle mismatch is zero. Similarly, where the predetermined duty cycles of the two complementary signals are the same, then the amount of predetermined duty cycle mismatch is zero. Two complementary signals of a pair have undistorted duty cycles when their duty cycle mismatch is at the predetermined amount of duty cycle mismatch, or within an acceptable range of duty cycle mismatch values. The acceptable range may be centered around the predetermined amount of duty cycle mismatch. For example, the acceptable range may be a set of duty cycles mismatch values defined by the predetermined duty cycle mismatch amount plus-or-minus a predetermined error amount or plus-or-minus a certain percentage of the predetermined duty cycle mismatch amount. A pair of complementary signals has undistorted duty cycles when their duty cycle mismatch is at the predetermined duty cycle mismatch amount or within the acceptable range of duty cycle mismatch. Alternatively, a pair of complementary signals has distorted duty cycles when their duty cycle mismatch deviates from the predetermined duty cycle mismatch amount or outside of the range of acceptable duty cycle mismatch values. For a given pair of complementary signals, an amount of duty cycle distortion is a difference between an actual duty cycle mismatch of the complementary signals and the predetermined duty cycle mismatch amount.

An amount of duty cycle mismatch may be an instantaneous value that indicates a difference of the instantaneous duty cycle of one signal and the instantaneous duty cycle of another signal for a single period or cycle of the signals. Alternatively, the duty cycle mismatch may be an average value that indicates a difference of an average duty cycle of one signal and the average duty cycle of another signal for a predetermined number of cycles or periods and/or over a plurality of periods or cycles occurring over a predetermined period of time.

Similarly, an amount of duty cycle distortion for a single signal may be an instantaneous value that indicates a difference of the instantaneous duty cycle of the signal for single period or cycle and the predetermined duty cycle of the signal. Alternatively, the amount of duty cycle distortion for a single signal may be an average value that indicates a difference of the average duty cycle of the signal for a predetermined number of cycles or periods and/or over a plurality of periods or cycles occurring over a predetermined period of time. Likewise, the amount of duty cycle distortion for a pair of complementary signals may be an instantaneous value that indicates a difference of an instantaneous amount of duty cycle mismatch between the two signals and a predetermined duty cycle mismatch amount, or an average value that indicates a difference of an average amount of duty cycle mismatch between the two signals for a predetermined number of cycles or a plurality of periods or cycles occurring over a predetermined period and the predetermined duty cycle mismatch amount.

In the event that any of the pair of complementary input signals REnx, BREnx, the first pair of complementary intermediate signals REAMP, BREAMP, or the second pair of complementary intermediate signals REx, BREx have duty cycles that cause the pair of complementary output signals DQS, BDQS to have distorted duty cycles, the duty cycle correction circuit 100 may be configured to perform a correction process that adjusts or modifies one or more characteristics of the first pair of complementary intermediate signals REAMP, BREAMP and/or the second pair of complementary intermediate signals REx, BREx so that the pair of output signals DQS, BDQS are output with undistorted duty cycles. As described in further detail below, non-limiting example characteristics of the intermediate signals that are adjusted or modified may include gain, high voltage level, low voltage level, common mode voltage, cross-point, or duty cycle. In some example configurations, the predetermined duty cycle is 50%, although other predetermined duty cycle percentages may be possible.

As shown in FIG. 1, the data alignment circuit 106 may be configured to receive the second pair of complementary intermediate signals REx, BREx from the amplifier circuit 104. The data alignment circuit 106 may be configured to perform an alignment process with second pair of complementary intermediate signals REx, BREx and the data signal(s) it receives such that the output data signal(s) are aligned with the pair of complementary output signals DQS, BDQS. By being aligned, the data pulses of the output data signal(s), such as the rising and falling transitions of the data pulses, occur at certain times relative to the rising and falling transitions or edges of the pair of complementary output signals DQS, BDQS. In some example configurations, the output data signal(s) may be aligned with the pair of complementary output signals DQS, BDQS in that their rising and falling transitions occur at the same time or about the same time that the complementary output signals DQS, BDQS perform their respective rising and falling transitions. In other example configurations, the output data signal(s) may be aligned with the pair of complementary output signals DQS, BDQS in that their rising and falling transitions occur at a certain, predetermined offset relative to the times that the pair of complementary output signals DQS, BDQS perform their respective rising and falling transitions. For example, the rising and falling transitions of the data signal(s) may occur at midpoints between consecutive rising and falling transitions of the pair of complementary output signals DQS, BDQS. In other words, the data signal(s) may be delayed or phase shifted 90-degrees relative to the pulses of the pair of complementary output signals DQS, BDQS. In addition or alternatively, the data signals and the complementary output signals DQS, BDQS may be aligned in accordance with a signaling or communication scheme, such as a single data rate (SDR) or a double data rate (DDR) communication scheme. The data alignment circuit 106 may include any of various types of circuits to perform the alignment process, including logic circuitry, combinational logic circuitry, flip-flops, and multiplexers, and non-limiting examples.

The controller 102 may be a feedback circuit that forms a feedback path for the amplifier circuit 104 and the data alignment circuit 106. As shown in FIG. 1, the controller 102 may be coupled to the output of the data alignment circuit 106 and be configured to receive the complementary output signals DQS, BDQS. In response to receipt of the complementary output signals DQS, BDQS, the controller 102 may be configured to perform a duty cycle correction process, which includes determining duty cycle distortion in the pair of output signals DQS, BDQS by measuring or detecting a duty cycle mismatch between the complementary output signals DQS, BDQS. Based on the measured or detected duty cycle mismatch, the controller 102 may set and/or adjust at least one of a gain of the amplifier circuit 104 or a common mode voltage of at least one of the first pair of intermediate signals REAMP, BREAMP. To do so, the controller 102 may be configured to output or inject a control current Ictrl at one or more target current amounts or levels into the amplifier circuit 104. In response to receipt of the control current Ictrl, the amplifier circuit 104 may be configured to adjust or modify its gain and a common mode voltage level at which it generates the first pair of complementary intermediate signals REAMP and BREAMP. As a result of the amplifier circuit 104 adjusting the gain and the common mode voltage of the first pair of intermediate signals REAMP, BREAMP, the duty cycles of the second pair of complementary intermediate signals REx, BREx, and in turn the duty cycles of the pair of complementary output signals DQS, BDQS, are adjusted or modified.

As part of the duty cycle correction process, the controller 102 may continually detect or monitor the duty cycle mismatch of the pair of complementary output signals DQS, BDQS over an N-number of iterations or cycles. As described in further detail below, the controller 102 may adjust the amount of the control current Ictrl it injects into the amplifier circuit 104 in response to detecting the duty cycle mismatch. The controller 102 may search for and/or select target current amounts at which to inject the control current Ictrl to compensate for the duty cycle distortion as indicated by the duty cycle mismatch between the output signals DQS, BDQS. The controller 102 may do so by identifying which of the output signals DQS, BDQS has the higher duty cycle and which of the duty cycles as the lower duty cycle, and inject the control current Ictrl at amounts to bring the two duty cycles closer together and reduce their mismatch. The controller 102 may continue to increase the amount of the control current Ictrl as long as the one duty cycle stays higher than the other. However, in the event that the duty cycle amounts change or flip—i.e., the duty cycle that was the lower duty cycle is now the higher duty cycle—the controller 102 may detect this change, determine that it has overcompensated for the duty cycle distortion, and reduce the amount of the control current Ictrl.

The controller 102 may include a duty cycle identification circuit 108 that is configured to receive the complementary output signals DQS, BDQS, identify the duty cycles of each of the complementary output signals DQS, BDQS, and output duty cycle identification signals D_ID, BD_ID at levels, such as voltage levels, that indicate the duty cycles of the complementary output signals DQS, BDQS. In particular, a level of a first duty cycle identification signal D_ID may indicate the duty cycle of the first output signal DQS and a level of the second duty cycle identification signal BD_ID may indicate the duty cycle of the second output signal BDQS.

For some example configurations, the duty cycle identification circuit 108 may include averaging circuitry that is configured to average the duty cycles of each of the first and second output signals DQS, BDQS over time or cycles of the output signals DQS, BDQS, and the levels of each of the first and second duty cycle identification signals represent or indicate the averaged duty cycles. The averaging circuitry may include low pass filters (LPF), such as a resistor-capacitor (RC) filters, that filter out high frequency or alternating current (AC) components of the output signals DQS, BDQS. The output of the low pass filters are a pair of direct current (DC) voltage levels that indicate averaged duty cycles of the output signals DQS, BDQS. FIG. 1 shows the duty cycle identification circuit 108 as including a first low pass filter (LPF) 110 configured to receive the first output signal DQS and generate the first duty cycle identification signal D_ID and a second low pass filter (LPF) 112 configured to receive the second output signal BDQS and generate the second duty cycle identification signal BD_ID.

The controller 102 may further include a duty cycle comparison circuit 114 that is configured to compare the duty cycles of the output signals DQS, BDQS in order to measure their duty cycle mismatch. Based on the comparison, the duty cycle comparison circuit 114 may determine which of the duty cycles and which is lower, and output a comparison result signal CR that indicates the determination. The duty cycle comparison circuit 114 may identify and use the levels of the duty cycle identification signals D_ID, BD_ID to in order compare the duty cycles. The duty cycle comparison circuit 114 may identify which of the duty cycle identification signals D_ID, BD_ID is higher and output the comparison result signal CR at a high level or a low level to indicate the identification and which of the output signals DQS, BDQS has a higher duty cycle.

Figure 2:
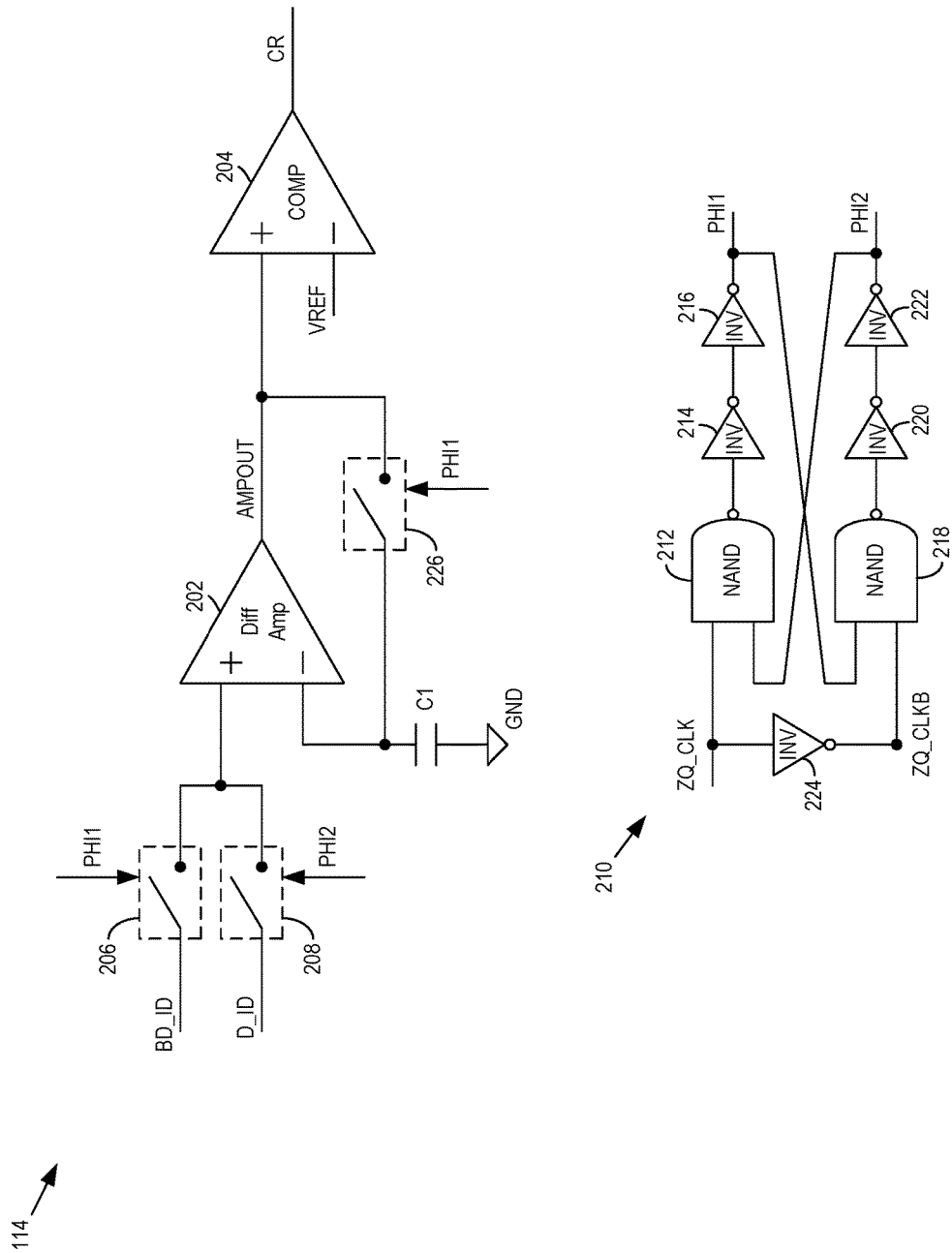
FIG. 2 is a block diagram of an example configuration of duty cycle comparison circuit of the duty cycle correction circuit of FIG. 1.

FIG. 2 shows a block diagram of an example configuration of the duty cycle comparison circuit 114. The duty cycle comparison circuit 114 may include a differential amplifier (Diff Amp) 202 and a comparator circuit (COMP) 204. The differential amplifier 202 may be configured to generate an output signal AMPOUT having a voltage level indicative of the difference between the levels of the first and second duty cycle identification signals D_ID, BD_ID. The comparator circuit 204 may be configured to receive the output signal AMPOUT and compare the voltage level of the output signal AMPOUT with a reference voltage VREF. If the level of the first duty cycle identification signal D_ID is higher than the level of the second duty cycle identification signal BD_ID—indicating that the duty cycle of the first output signal DQS is higher than the duty cycle of the second output signal BDQS—the differential amplifier 202 may generate the output signal AMPOUT to be at a positive voltage level and/or a voltage level that is greater than the reference voltage VREF. In response, the comparator circuit 204 may generate the comparison result signal CR at a high level, or a level corresponding to logic 1 value, indicating that the duty cycle of the first output signal DQS is higher than the duty cycle of the second output signal BDQS. Alternatively, if the level of the first duty cycle identification signal D_ID is lower than the level of the second duty cycle identification signal BD_ID—indicating that the duty cycle of the first output signal DQS is lower than the duty cycle of the second output signal BDQS—then the differential amplifier 202 may generate the output signal AMPOUT to be at negative voltage level and/or a voltage level that is lower than the reference voltage VREF. In response, the comparator circuit 204 may generate the comparison result signal CR at a low level, or a level corresponding to logic 0 value, indicating that the duty cycle of the first output signal DQS is lower than the duty cycle of the second output signal BDQS.

In order for the differential amplifier 202 to compare the levels of the first and second duty cycle identification signals D_ID, BD_ID, duty cycle comparison circuit 114 may be configured to operate in two duty cycle comparison phases, including a first phase and a second phase. As shown in FIG. 2, an input of the duty cycle comparison circuit 114 configured to receive the first and second duty cycle identification signals D_ID, BD_ID may include switching circuitry, including a first switch 206 and a second switch 208. In response to the first switch 206 being closed, the first switch 206 may receive the second duty cycle identification signal BD_ID and pass the second duty cycle identification signal BD_ID to a positive input terminal of the differential amplifier 202. In addition, in response to the second switch 208 being closed, the second switch 208 may receive the first duty cycle identification signal D_ID and pass the first duty cycle identification signal D_ID to the positive input terminal of the differential amplifier 202.

The first and second switches 206, 208 may be configured to be alternatingly closed and open, such that when one of the switches 206, 208 is closed, the other is open. This way, only one of the first duty cycle identification signal D_ID or the second duty cycle identification signal BD_ID is supplied to the positive input terminal of the differential amplifier 202 at any given moment in time.

The opening and closing of the first and second switches 206, 208 may be controlled by a pair of control signals PHI1, PH2. In particular, a first control signal PHI1 of the pair may control the opening and closing of the first switch 206, and a second control signal PHI2 of the pair may control the opening and closing of the second switch. In some example configurations, the first and second control signals PHI1, PHI2 may be implemented as a pair of non-overlapping, complementary clock signals, where when one of the control signals PHI1, PHI2 is at its high level, the other is at its low level. Assuming that the high levels of the control signals PHI1, PHI2 cause their corresponding switches 206, 208 to be closed and the low levels of the control signals PHI1, PHI2 cause their corresponding switches 206, 208 to be open, when the first control signal PHI1 is at its high level and the second control signal PHI2 is at its low level, the first switch 206 will be closed and the second switch 208 will be open so that the second duty cycle identification signal BD_ID is supplied to the positive input terminal of the differential amplifier 202. Alternatively, when the second control signal PHI2 is at its high level and the first control signal PHI1 is at its low level, the second switch 208 will be closed and the first switch 206 will be open so that the first duty cycle identification signal D_ID is supplied to the positive input terminal of the differential amplifier 202.

The duty cycle comparison circuit 114 may include or be in communication with a non-overlapping clock generator 210 that is configured to generate the control signals PHI1, PHI2. An example circuit configuration of the non-overlapping clock generator 210 is shown in FIG. 2. In the example configuration, the non-overlapping clock generator 210 may include two chains, with a first chain including a NAND gate 212 and a plurality of inverters (INV) 214, 216, and a second chain including a NAND gate 218 and a plurality of inverters (INV) 220, 222. The two chains are cross-coupled together in that the output of the last inverter 216 of the first chain is coupled to a first input of the NAND gate 218 of the second chain, and the last inverter 222 of the second chain is coupled to a first input of the NAND gate 212 of the first chain. A second input of the NAND gate 212 of the first chain is configured to receive an input clock signal ZQ_CLK, and a second input of the NAND gate 218 of the second chain is configured to receive an inverted input clock signal ZQ_CLKB. The non-overlapping clock generator 212 may include an inverter circuit 224 configured to receive the input clock signal ZQ_CLK, invert the input clock signal ZQ_CLK to generate the inverted input clock signal ZQ_CLKB, and supply the inverted input clock signal ZQ_CLKB to the second input of the NAND gate 218. The first chain may be configured to generate the first control signal PHI1 and the second chain may be configured to generate the second control signal PHI2. The control signals PHI1, PHI2 may be referred to as non-overlapping in that the non-overlapping clock generator 210 may be configured to generate the control signals PHI1, PHI2 with an amount of dead time to ensure that no overlap occurs between pulses of the control signals PHI1, PHI2, and in turn, to ensure that no portions of the first and second duty cycle identification signals D_ID, BD_ID are sent to the positive input terminal of the differential amplifier 202 at the same time.

As mentioned, the duty cycle comparison circuit 114 may be configured to operate in two phases in order for the differential amplifier 202 to compare the levels of the first and second duty cycle identification signals D_ID, BD_ID and generate its output signal AMPOUT indicate of a difference between the levels of the two identification signals D_ID, BD_ID. In the first phase, the first control signal PHI1 may be at its high level and the second control signal PHI2 may be at its low level. In turn, the first switch 206 may be closed, the second switch 208 may be open, and the first switch 206 may supply the second duty cycle identification signal BD_ID to the positive input terminal of the differential amplifier 202.

The duty cycle comparison circuit 114 may further include a third switch 226 having a first end coupled to the output of the differential amplifier 202 and a second end coupled to the negative input terminal of the differential amplifier 202. The duty cycle comparison circuit 114 may further a capacitor C1 (or other charge-storing circuit) having a first end coupled to the negative input terminal of the differential amplifier 202 and the second end of the third switch 226, and a second end coupled to ground (GND). The third switch 226 may be configured to be controlled by the first control signal PHI1. Also, for some example configurations, the differential amplifier 202 may be configured to have unity gain, meaning that the voltage level of the output signal AMPOUT may be the same or about the same as the difference in voltage levels of the voltage at the positive input terminal and the voltage at the negative input terminal.

As mentioned, the differential amplifier 202 may be configured to generate its output signal AMPOUT in two phases. In the first phase, the first control signal PHI1 may be at its high level and the second control signal PHI2 may be at its low level. In turn, the first switch 206 may be closed, the second switch 208 may be open, and the first switch 206 may supply the second duty cycle identification signal BD_ID to the positive input terminal of the differential amplifier 202. Also, the third switch 226 may be closed, and so the voltage level of the output signal AMPOUT may be fed back to the negative input terminal of the differential amplifier 202.

In the first phase, the voltage level of the output signal AMPOUT will be equal to the voltage level of the second duty cycle identification signal BD_ID due to the unity gain of the differential amplifier 202. In addition, in the first phase, the third switch 226 is closed, and so the voltage level of the output signal AMPOUT is fed back to the negative input terminal of the differential amplifier 202 and maintained across the capacitor C1. Accordingly, in the first phase, the voltage level of the second duty cycle identification signal BD_ID may be generated at the negative input terminal of the differential amplifier 202 and maintained across the capacitor C1.

In the second phase, the second control signal PHI2 may be at its high level and the first control signal PHI1 may be at its low level. In turn, the first switch 206 may be open, the second switch 208 may be closed, and the second switch 208 may supply the first duty cycle identification signal BD_ID to the positive input terminal of the differential amplifier 202. Also, the third switch 226 may be open, and so the negative input terminal of the differential amplifier 202 may be floating with respect to the output of the differential amplifier 202. The voltage stored across the capacitor C1 may be maintained when the third switch 226 opens. Accordingly, in the second phase, the voltage level of the second duty cycle identification signal BD_ID maintained across the capacitor C1 is applied to the negative input terminal of the differential comparator 202. Accordingly, in the second phase, the differential amplifier 202 may be configured to output signal AMPOUT at a voltage level corresponding to and/or indicative of the difference between the voltage level of the first duty cycle identification signal D_ID received at the positive input terminal and the second duty cycle identification signal BD_ID received at the negative input terminal.

As previously described, in response to the level of the first duty cycle identification signal D_ID being greater than the level of the second duty cycle identification signal BD_ID, the differential amplifier 202 may generate the output signal AMPOUT at a level greater than the reference voltage REF so that the comparator circuit 204 generates the comparison result signal CR at a high level. Alternatively, in response to the level of the first duty cycle identification signal D_ID being less than the level of the second duty cycle identification signal BD_ID, the differential amplifier 202 may generate the output signal AMPOUT at a level less than the reference voltage REF so that the comparator circuit 204 generates the comparison result signal at a low level.

In sum, the duty cycle comparison circuit 114 may be configured to compare the duty cycles of the output signals DQS, BDQS by operating in two phases to compare the levels of the first and second duty cycle identification signals D_ID, BD_ID. In the first phase, the second duty cycle identification signal BD_ID is applied to the positive input terminal of the differential amplifier 202 and then fed back to the negative input terminal so that the voltage at the negative input terminal is at the level of the second duty cycle identification signal BD_ID. The voltage at that level is maintained across the capacitor C1. In the second phase, the first duty cycle identification signal D_ID is applied to the positive input terminal of the differential amplifier 202, with the voltage level of the second duty cycle identification signal BD_ID being applied to the negative input terminal. In response, the differential comparator 202 may compare the levels of the duty cycle identification signals D_ID, BD_ID, and generate its output signal AMPOUT at a voltage level indicative of the difference. In response to the level of the first duty cycle identification signal D_ID being greater than the level of the second duty cycle identification signal BD_ID, the comparator circuit 204 will generate the comparison result signal CR at a high level. Alternatively, in response to the level of the first duty cycle identification signal BD_ID being less than the level of the second duty cycle identification signal BD_ID, the comparator circuit 204 will generate the comparison result signal CR at a low level.

In addition, by operating in two phases, the comparison operation performed by the duty cycle comparison circuit may have the effect of cancelling out or minimizing any offset voltage Vos present in the differential amplifier 202. That is, due to process variations or other defects, the differential comparator 202 may have an offset voltage Vos at its input terminals that the differential comparator 202 undesirably amplifies when generating its output signal AMPOUT. If not properly removed, the offset voltage Vos may cause the differential amplifier 202 to generate its output signal AMPOUT at a level that does not accurately indicate the difference of the levels of the first and second duty cycle identification signal D_ID, BD_ID. If the offset voltage Vos is large enough, it may cause the comparator circuit 204 to generate the comparison result signal CR at an incorrect level, meaning that the comparator circuit 204 may generate the comparison result signal CR at a high level when the level of the first duty cycle identification signal D_ID is actually lower than the level of the second duty cycle identification signal BD_ID, or may generate the comparison result signal CR at a low level when the level of the first duty cycle identification signal D_ID is actually higher than the level of the second duty cycle identification signal BD_ID. However, in the event that the differential amplifier 202 has an offset voltage Vos, the offset voltage Vos is part of the voltage that is amplified and applied to the negative input terminal in the first phase. Then, in the second phase, the offset voltage Vos is again present at the positive input terminal. Because the offset voltage is now present at both the positive input terminal and the negative input terminal in the second phase, the differential amplifier 202 effectively cancels out the offset voltage Vos when amplifying the difference of the voltage levels at the positive and negative terminals to generate its output signal AMPOUT.

Referring back to FIG. 1, the duty cycle comparison circuit 114 may be configured to output the comparison result signal CR to a search circuit 116. In response to the level of the comparison result signal CR, the search circuit 116 may be configured to search for one or more target current amounts for the control current Ictrl that causes the data alignment circuit 106 to reduce the amount of duty cycle mismatch between output signals DQS, BDQS. The goal of the searching is to finding a target current amount that causes the data alignment circuit 106 to output the complementary output signals DQS, BDQS with a minimum amount of duty cycle mismatch and/or with undistorted duty cycles. In response to identifying a current amount or level for the control current Ictrl, the search circuit 116 may generate and output one or more current control signals CC to a current injection circuit 118. In response, the current injection circuit 118 may be configured to generate the control current Ictrl at a level or amount corresponding to the one or more current control signals CC and inject the control current Ictrl into the amplifier circuit 104.

As described in further detail below, the duty cycle correction circuit 100 may be configured to perform the duty cycle correction process in an N-number of iterations or cycles. In each cycle, the duty cycle comparison circuit 114 may be configured to generate its comparison result signal CR at a level indicative of which of the duty cycles of the output signals DQS, BDQS is higher. Accordingly, in each iteration of the duty cycle correction process, the search circuit 116 may be configured to search for and identify a target current amount corresponding to the level of the comparison result signal CR, and output the current control signal CC at a level or value to cause the current injection circuit 118 to output the control current Ictrl at the identified amount. At the end of the N-number of cycles, the search circuit 116 will have searched for and identified a final target current amount for the control current Ictrl that provides a minimum amount of duty cycle mismatch or distortion between the output signals DQS, BDQQS.

The search circuit 116 may be implemented in hardware or a combination of hardware and software to perform its functions or actions. For at least some example configurations where the search circuit includes a combination of hardware and software, the search circuit 116 may include a processor configured to execute the software, which may be stored in a memory that is part of or separate from the search circuit 116. Before describing further details of the search circuit 116, further details of the amplifier circuit 104 and the current injection circuit 104 are now described.

The amplifier circuit 104 is a two-stage amplifier that includes a first stage circuit 120 and a second stage circuit 122. The first stage circuit 120 may be configured to receive the pair of input signals REnx, BREnx, and in response, generate the first pair of intermediate signals REAMP, BREAMP. The second stage circuit 122 may be configured to receive the first pair of intermediate signals REAMP, BREAMP, and in response generate the second pair of intermediate signals REx, BREx. The second stage circuit 122 may output the second pair of intermediate signals REx, BREx to the data alignment circuit 106.

In addition, the first stage circuit 120 may be configured with an amount of gain by which to amplify the input signals REnx, BREnx to generate the first pair of intermediate signals REAMP, BREAMP. The gain, which may be an alternating current (AC) voltage gain, is an operating characteristic of the first stage circuit 120 that determines the voltage levels of the first pair of intermediate signals REAMP, BREAMP relative to the voltage levels of the pair of input signals REnx, BREnx. The gain may also be a characteristic of the first pair of intermediate signals REAMP, BREAMP, indicating how much the first pair of intermediate signals REAMP, BREAMP are amplified relative to the levels of the input signals REnx, BREnx. The gain of the first stage circuit 120 may include two single-ended gains, including a first single-ended gain and a second single-ended gain. The first single-ended gain may be a ratio of the difference between the high and low voltage levels of the first intermediate signal REAMP to the difference between the high and low voltage levels of first input signal REnx. Similarly, the second single-ended gain may be a ratio of the difference between the high and low voltage levels of the second intermediate signal BREAMP to the difference between the high and low voltage levels of the second input signal BREnx. The difference between the high voltage level and the low voltage level of the signal may also be referred to as the signal's peak-to-peak voltage. The gain of the first stage circuit may also include a differential gain, which may be the ratio of the difference between the first pair of intermediate signals REAMP, BREAMP to the difference between the input signals REnx, BREnx.

The second stage circuit 122 may be configured as a cross-point detection circuit, meaning that it is configured to generate the second pair of intermediate signals REx, BREx in response to detection of cross-points of the first pair of intermediate signals REAMP, BREAMP. As used herein, a cross-point is a characteristic of a pair of complementary signals, and cross-points occur at the time that the voltage levels of the two complementary signals are the same. With respect to the first pair of intermediate signals REAMP, BREAMP, a cross-point occurs when the first intermediate signal REAMP is performing a rising transition and the second intermediate signal BREAMP is performing a falling transition, and the voltage levels of the two signals REAMP, BREAMP reach the same voltage level. Another cross-point occurs when the first intermediate signal REAMP is performing a falling transition and the second intermediate signal BREAM is performing a rising transition, and the voltage levels of the two signals REAMP, BREAMP reach the same voltage level.

The second stage circuit 122 may be configured to detect the occurrence of cross-points of the first pair of intermediate signals REAMP, BREAMP, and in response, transition the second pair of intermediate signals REx, BREx between high and low levels. In a particular example configuration, the second stage circuit 122 may be configured to generate the first signal of the second intermediate pair REx at voltage levels that directly track the voltage levels of the first signal of the first intermediate pair REAMP. So, when the first signal of the first intermediate pair REAMP is at its high level, the second stage circuit 122 may generate the first signal of the second intermediate pair REx at its high level, and when the first signal of the first intermediate pair REAMP is at its low level, the second stage circuit 122 may generate the first signal of the second intermediate pair REx at its low level. Similarly, the second stage circuit 122 may be configured to generate the second signal of the second intermediate pair BREx at voltage levels that directly track the voltage levels of the second signal of the first intermediate pair BREAMP. So, when the second signal of the first intermediate pair BREAMP is at its high level, the second stage circuit 122 may generate the second signal of the second intermediate pair BREx at its high level, and when the second signal of the first intermediate pair BREAMP is at its low level, the second stage circuit 122 may generate the second signal of the second intermediate pair REx at its low level. Under this example configuration, when the second stage circuit 122 detects an occurrence of a cross-point due the first signal of the first intermediate pair REAMP performing a rising transition and the second signal of the first intermediate pair BREAMP performing a falling transition, the second stage circuit 122 may respond by transitioning the first signal of the second intermediate pair REx from its low level to its high level and transitioning the second signal of the second intermediate pair BREx from its high level to its low level. On the other hand, when the second stage circuit 122 detects an occurrence of a cross-point due the first signal of the first intermediate pair REAMP performing a falling transition and the second signal of the first intermediate pair BREAMP performing a rising transition, the second stage circuit 122 may respond by transitioning the first signal of the second intermediate pair REx from its high level to its low level and transitioning the second signal of the second intermediate pair BREx from its low level to its high level. Other example configurations where the second stage circuit 122 is configured to generate the second pair of intermediate signals REx, BREx at voltage levels that indirectly track the voltage levels of the first pair of intermediate signals REAMP, BREAMP may be possible.

As shown in FIG. 1, the first stage circuit 120 may be configured to generate the first intermediate signal REAMP at an output node A and the second intermediate signal BREAMP at an output node B. The current injection circuit 118 may be configured to inject the control current Ictrl into one of the output nodes A, B. Which of the output nodes A, B the current injection circuit 118 injects the control current Ictrl into may depend on whether, in the first of the N-number of iterations of the duty cycle correction process, the first output signal DQS or the second output signal BDQS has the signal DQS or the second output signal BDQS has the higher duty cycle. In particular, during the first iteration, if the comparison result signal CR indicates that the first output signal DQS has the higher duty cycle, then the current injection circuit 118 may be configured to inject the control current Ictrl into output node A associated with the first intermediate signal REAMP. Alternatively, during the first iteration, if the comparison result signal CR indicates that the second output signal BDQS has the higher duty cycle, then the current injection circuit 118 may be configured to inject the control current Ictrl into output node B associated with the second intermediate signal BREAMP.

Injection of the control current Ictrl into one of the output nodes A, B may have the effect of reducing the gain of the first stage circuit 120, which in turn may reduce the gain of the first pair of intermediate signals REAMP, BREAMP relative to the pair of input signals REnx, BREnx. In particular, the injection of the control current Ictrl into an output node may have the effect of reducing the gain of the first pair that is generated at the output node. So, injection of the control current Ictrl into output node A may cause the first stage circuit 120 to generate the first intermediate signal REAMP at output node A with a reduced amount of gain compared to if the control current Ictrl is not injected into output node A. Likewise, injection of the control current Ictrl into output node B may cause the first stage circuit 120 to generate the second intermediate signal BREAMP at output node B with a reduced amount of gain compared to if the control current Ictrl is not injected into output node B. When the control current is injected into an output node, the amount by which the gain is reduced may be proportional to the amount of the control current Ictrl. In addition, increasing the amount of the control current Ictrl may cause the gain to decrease and decreasing the amount of the control current Ictrl may cause the gain to increase. Overall, though, because some amount of control current Ictrl injected into an output node causes the gain of the signal generated at the node to be reduced, the gain of the first pair of intermediate signals REAMP, BREAMP relative to the pair of input signal REnx, BREnx is reduced.

In addition, injection of the control current Ictrl into an output node may cause the first stage circuit 120 to generate the intermediate signal at the output node with an increased common mode voltage compared to if the control current Ictrl is not injected. As used herein, common mode voltage of a signal is a DC voltage that is an average of the high voltage level and the low voltage level of the signal. Otherwise stated, the common mode voltage is a DC voltage about which the signal toggles or oscillates. So, injection of the control current Ictrl into output node A may cause the first stage circuit 120 to generate the first intermediate signal REAMP at output node A with an increased common mode voltage. Likewise, injection of the control current Ictrl into output node B may cause the first stage circuit 120 to generate the second intermediate signal BREAMP at output node B with an increased common mode voltage. Without injection of the control current Ictrl, the first stage circuit 120 may generate the first pair of intermediate signals REAMP, BREAMP with the same common mode voltage level. Alternatively, by injecting the control current Ictrl into one of the output nodes A, B, the first stage circuit 120 may generate the first pair of intermediate signals REAMP, BREAMP so that one of the signals REAMP, BREAMP has a common mode voltage that is higher than the other. In addition, the amount by which the common mode voltage of an intermediate signal increases may be proportional to the amount of the control current Ictrl that is injected. Accordingly, increasing the amount of the control current Ictrl may cause the common mode voltage to increase, and decreasing the amount of control current Ictrl may cause the common mode voltage to decrease.

In general, during the duty cycle correction process, the controller 102 may be configured to select which of the output nodes A, B into which to inject the control current Ictrl, and over the N-number of iterations, the controller 102 may adjust the amount of the control current Ictrl injected into the selected output node based on monitoring or comparing the duty cycles and the corresponding duty cycle mismatch of the output signals DQS, BDQS. In response to the injection of the control current Ictrl into the selected output node, the first stage circuit 120 may be configured to generate the first pair of intermediate signals REAMP, BREAMP with a reduced amount of gain and the intermediate signal generated at the selected node with an increased common mode voltage. The amount of the reduction in gain and the amount of the increase in common mode voltage may correspond to the amount of the control current Ictrl. The decrease in gain and increase in common mode voltage may adjust when the cross-points of the first pair of intermediate signals REAMP, BREAMP occur. The adjustment in the cross-point, in turn, affects when the second stage circuit 122 detects the cross-points and transitions the levels of the second pair of intermediate signals REx, BREx. Adjusting when the transitions of the second pair of intermediate signals REx, BREx occur adjusts the duty cycles of the second pair of intermediate signals REx, BREx, which in turn adjusts the duty cycles of the output signals DQS, BDQS. Accordingly, adjusting the amount of the control current Ictrl adjusts the duty cycles of the output signals DQS, BDQS. Over the N-number of iterations of the duty cycle correction process, the controller 102 may operate as a feedback circuit by comparing the duty cycles of output signals DQS, BDQS and adjusting the amount of the control current Ictrl being injected into the selected one of the output nodes A, B. At the end of the N-number of iterations, the amount of the control current Ictrl may be an optimized amount that causes the duty cycles of the output signals DQS, BDQS to be as closely matched as possible, and/or for each of the duty cycles to be as close to the predetermined duty cycle as possible.

FIGS. 3A-E show timing diagrams to illustrate an example situation where the duty cycle correction circuit 100 receives a pair of input signals REnx, BREnx with distorted duty cycles, and the duty cycle correction circuit 100 performs a duty cycle correction process so that the pair of output signals DQS, BDQS have duty cycles at the predetermined duty cycle of 50%, despite the input signals REnx, BREnx having distorted duty cycles. The example presumes that the data alignment circuit 106 does not provide any distortion to the duty cycles, and so the duty cycles of the output signals DQS, BDQS match the duty cycles of the second pair of intermediate signals REx, BREx.

FIG. 3A shows the pair of input signals REnx, BREnx transitioning between an associated high voltage level $V_{H1}$ and an associated low voltage level $H_{L2}$. As shown in FIG. 3A, the duty cycle of the first input signal REnx has a lower duty cycle than the second output signal BREnx. In particular, the example assumes that the duty cycle of the second input signal BREnx is 60% and the duty cycle of the first input signal REnx is 40%.

FIGS. 3B and 3C show waveforms of the first pair of intermediate signals REAMP, BREAMP and the second pair of intermediate signals REx, BREx, respectively, in the event that no control current Ictrl is injected into the first stage circuit 120 of the amplifier 104. As shown in FIG. 3B, each of the intermediate signals REAMP, BREAMP transitions between an associated high voltage level $V_{H2a}$ and an associated low voltage level $V_{L2a}$. The difference between the high voltage level $V_{H2a}$ and the low voltage level $V_{L2a}$ associated with the intermediate signals REAMP, BREAMP may be greater than the voltage difference between the high voltage level $V_{H1}$ and the low voltage level $V_{L1}$ associated with the input signals REnx, BREnx, and the amount that the voltage difference is greater may correspond to the differential gain with which the first stage circuit 120 is configured to generate the first pair of intermediate signals REAMP, BREAMP. Also, as shown in FIG. 3B, the common mode voltage CM_R of the first intermediate signal REAMP and the common mode voltage CM_BR of the second intermediate signal BREAMP are at the same level.

Additionally, for some example configurations, the first stage circuit 120 may be configured to invert the input signals REnx, BREnx when amplifying them such that the first intermediate signal REAMP is an inverted, amplified version of the first input signal REnx, and the second intermediate signal BREAMP is an inverted, amplified version of the second input signal BREnx. In turn, the first pair of intermediate signals REAMP, BREAMP have reversed duty cycles. So, as shown in FIG. 3B, the first intermediate signal REAMP has the higher duty cycle than the second intermediate signal BREAMP. The high and low duty cycle levels may generally remain the same, though, and so the first intermediate signal REAMP is shown as having the 60% duty cycle and the second intermediate signal BREAMP is shown as having the 40% duty cycle.

Referring to FIG. 3C, the second stage circuit 122 may detect the cross-points CP of the intermediate signals REAMP, BREAMP and in response, transition the voltage levels of the second pair of intermediate signals REx, BREx between an associated high voltage level $V_{H3}$ and an associated low voltage level $V_{L3}$. For example, as shown in FIG. 3C, in response to a cross-point occurring when the first intermediate signal REAMP is performing a rising transition and the second intermediate signal BREAMP is performing a falling transition, the second stage circuit 122 may transition the first intermediate signal REx from its low voltage level $V_{L3}$ to its high voltage level $H_{H3}$ and transition the second intermediate signal BREx from its high voltage level $V_{H3}$ to its low voltage level $V_{L3}$. Because the intermediate signals REAMP, BREAMP transition between the same high and low voltage levels $V_{H2a}$, $V_{L2a}$ and transition about the same common mode voltage level, the cross-points track or correspond to the duty cycles of the first pair of intermediate signals REAMP, BREAMP. In turn, the second stage circuit 122, detects the cross-points and generates the second pair of intermediate signals REx, BREx with duty cycles corresponding to the duty cycles of the first pair of intermediate signals. So, as illustrated in FIG. 3C, the second stage circuit 122, in response to detecting the cross-points, generates the first intermediate signal REx with a 60% duty cycle and the second intermediate signals BREx with a 40% duty cycle.

As previously described, the example illustrated with respect to FIGS. 3A-3E does not assume that the data alignment circuit 106 does not contribute to distorting the duty cycles. Accordingly, in the example illustrated with respect to FIGS. 3B, 3C, when no control current Ictrl is injected into the first stage circuit 120, the data alignment circuit 106 will undesirably output the pair of output signals with mismatched duty cycles—with one being at 60% and the other being at 40%.

FIGS. 3D and 3E show waveforms of the first pair of intermediate signals REAMP, BREAMP and the second pair of intermediate signals REx, BREx, respectively, in the event that control current Ictrl is injected into the first stage circuit 120 of the amplifier 104. The waveforms shown in FIGS. 3D and 3E may be the state of the waveforms when the duty cycle correction process is finished. The control current Ictrl that is being injected into the first stage circuit 120 may be at an amount that causes the duty cycles the intermediate signals REx, BREx to be matched at 50% Otherwise stated, in the duty cycle correction process, the controller 102 searched for and identified an amount for the control current Ictrl that caused the duty cycle first intermediate signal of the second pair REx to decrease from 60% to 50% and that caused the duty cycle of the second intermediate signal of the second pair BREx to increase from 40% to 50%.

As indicated in FIG. 3D, the controller 102 may inject the control current Ictrl into output node B, which in turn may cause the gain of the second intermediate signal BREAMP to decrease. Also, injection of the control current Ictrl may cause the common mode voltage CM_BR of the second intermediate signal BREAMP to increase to a higher voltage level than the common mode voltage CM_R of the first intermediate signal REAMP.

As shown by a comparison of FIGS. 3B and 3D, changing the gain and the common mode voltage of the second intermediate signal BREAMP changes when the cross-points occur. FIG. 3D illustrates that the controller 102 has injected an amount of the control current Ictrl that causes the cross-points to occur over equally-spaced time intervals. In turn, the second stage circuit 122 may detect or track the change in cross-points and correspondingly change when it transitions the second pair of intermediate signals REx, BREx between their high and low voltage levels $V_{H3}$, $V_{L3}$. Accordingly, in response to the cross-points occurring at equally-spaced intervals due to the reduction in gain and increase in common mode voltage of the intermediate signal BREAMP, the second stage circuit 122 may be configured to generate the second pair of intermediate signals REx, BREx at the predetermined duty cycle of 50%.

FIGS. 4A-E show timing diagrams to illustrate another example situation where the data alignment circuit 106 distorts the duty cycles of the output signals DQS, BDQS. In this example situation, the controller 102 may be configured to inject an amount of the control current Ictrl into the amplifier circuit 104 that causes the second pair of intermediate signals to have a certain amount of duty cycle distortion that compensates for the distortion that the data alignment circuit 106 creates when generating the output signals DQS, BDQS. In turn, the data alignment circuit 106 may output the output signals DQS, BDQS at the predetermined duty cycle of 50%.

Figure 4A:
FIG. 4A is a timing diagram of example waveforms of a pair of complementary input signals with undistorted duty cycles.
Figure 4B:
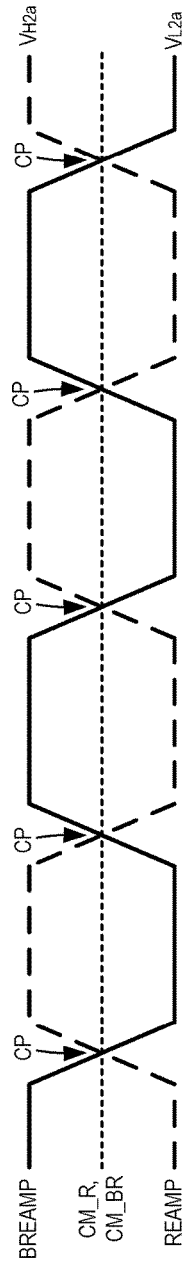
FIG. 4B is a timing diagram of example waveforms of a first pair of complementary input signals generated in response to the pair of complementary input signals of FIG. 3A without current injection.
Figure 4C:
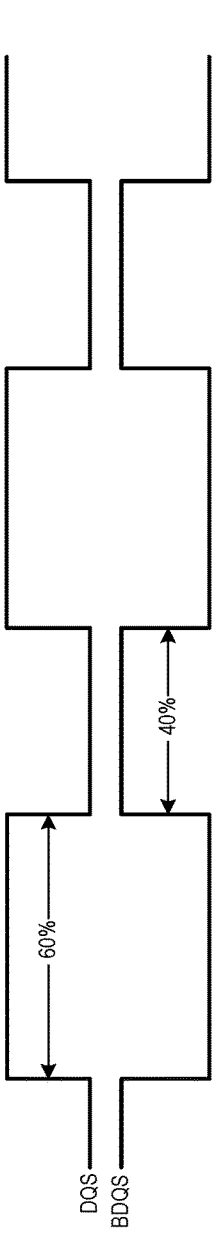
FIG. 4C is a timing diagram of example waveforms of a pair of complementary output signals generated in response to duty cycle distortion added during data alignment after the first pair of complementary signals of FIG. 4B is generated.

As shown in FIG. 4A, the example situation assumes that the duty cycle correction circuit 100 receives the input signals REnx, BREnx with undistorted duty cycles—i.e., the duty cycles of the input signals REnx, BREnx are both at 50%. FIGS. 4B and 4C show the example waveforms of the first pair of intermediate signals REAMP, BREAMP and the output signals DQS, BDQS, respectively, generated in response to the input signals REnx, BREnx in the event that no control current Ictrl is injected into the first stage circuit 120. Similar to FIG. 3B, FIG. 4B shows the first pair of intermediate signals REAMP, BREAMP being amplified, inverted versions of the input signals REnx, BREnx, with the common mode voltage CM_R of the first intermediate signal REnx and the common mode voltage CM_BR of second intermediate signal BREnx being the same. Although not shown, in this situation, the second stage circuit 122 would detect the cross-points CP and in response, generate the second pair of intermediate signals REx, BREx each with the predetermined, undistorted duty cycle of 50%. However, because the data alignment circuit 106 adds distortion to the duty cycles, FIG. 4C shows the output signals DQS, BDQS with distorted duty cycles, with the duty cycle of first output signal DQS being 60% and the duty cycle of the second output signal BDQS being 40%. In other words, despite the duty cycle correction circuit 100 receiving the input signals REnx, BREnx with undistorted duty cycles, due to the duty cycle distortion within the complementary signal path extending from the input of the first stage circuit 120 to the output of the data alignment circuit 106, the output signals DQS, BDQS are output with distorted duty cycles when no control current Ictrl is injected into the first stage circuit 120.

Figure 4D:
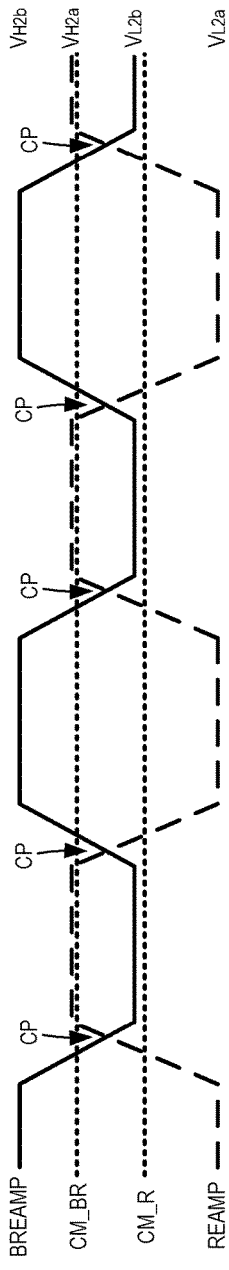
FIG. 4D is a timing diagram of example waveforms of a first pair of complementary input signals generated in response to the pair of complementary input signals of FIG. 4A with current injection.
Figure 4E:
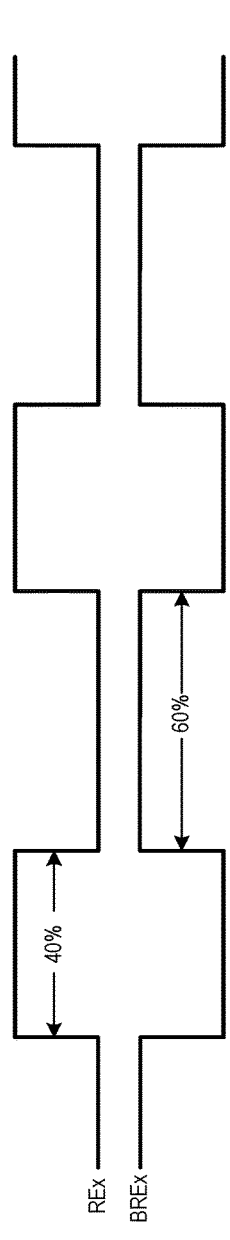
FIG. 4E is a timing diagram of example waveforms of a second pair of complementary input signals generated in response to the first pair of complementary intermediate signals of FIG. 4D with current injection.

Referring to FIG. 4D, the controller 102 may identify that the first output signal DQS has a higher duty cycle than the duty cycle of the second output signal BDQS, and in turn, inject the control current Ictrl into output node B. In turn, the first stage circuit 120 may generate the second intermediate signal BREAMP with reduced gain. In addition, the common mode voltage CM_BR of the second intermediate signal BREAMP increases. The reduction in gain and the increase in common mode voltage CM_BR of the second intermediate signal BREAMP adjusts or changes the timing intervals of when the cross-points of the first pair of intermediate signals REAMP, BREAMP occur. As shown in FIGS. 4D and 4E, by injecting the control current Ictrl into output node B, the time intervals at which the cross-points CP occur causes the duty cycle of the first intermediate signal of the second pair REx to decrease from 50% to 40%, and the duty cycle of the second intermediate signal of the second pair BREx to increase from 50% to 60%. Changing the duty cycles of the second pair of intermediate signals REx, BREx—in this case from undistorted levels to distorted levels—compensates for the duty cycle distortion that the data alignment circuit 106 adds when generating the output signals DQS, BDQS. For example, in comparing FIGS. 4C and 4E, the control current Ictrl is injected to cause the second stage circuit 122 to output the first intermediate signal of the second pair REx with a 40% duty cycle and the second intermediate signal of the second pair BREx with a 60% duty cycle to compensate for the 10% duty cycle distortion that the data alignment circuit 106 adds when generating the output signals DQS, BDQS. Accordingly, by compensating for the duty cycle distortion added by the data alignment circuit 106 and generating the first intermediate signal of the second pair REx and the second intermediate signal of the second pair BREx with distorted duty cycles of 40% and 60%, respectively, the data alignment circuit 106 will generate and output the output signals DQS, BDQS at the predetermined, undistorted duty cycle of 50%.

Figure 5:
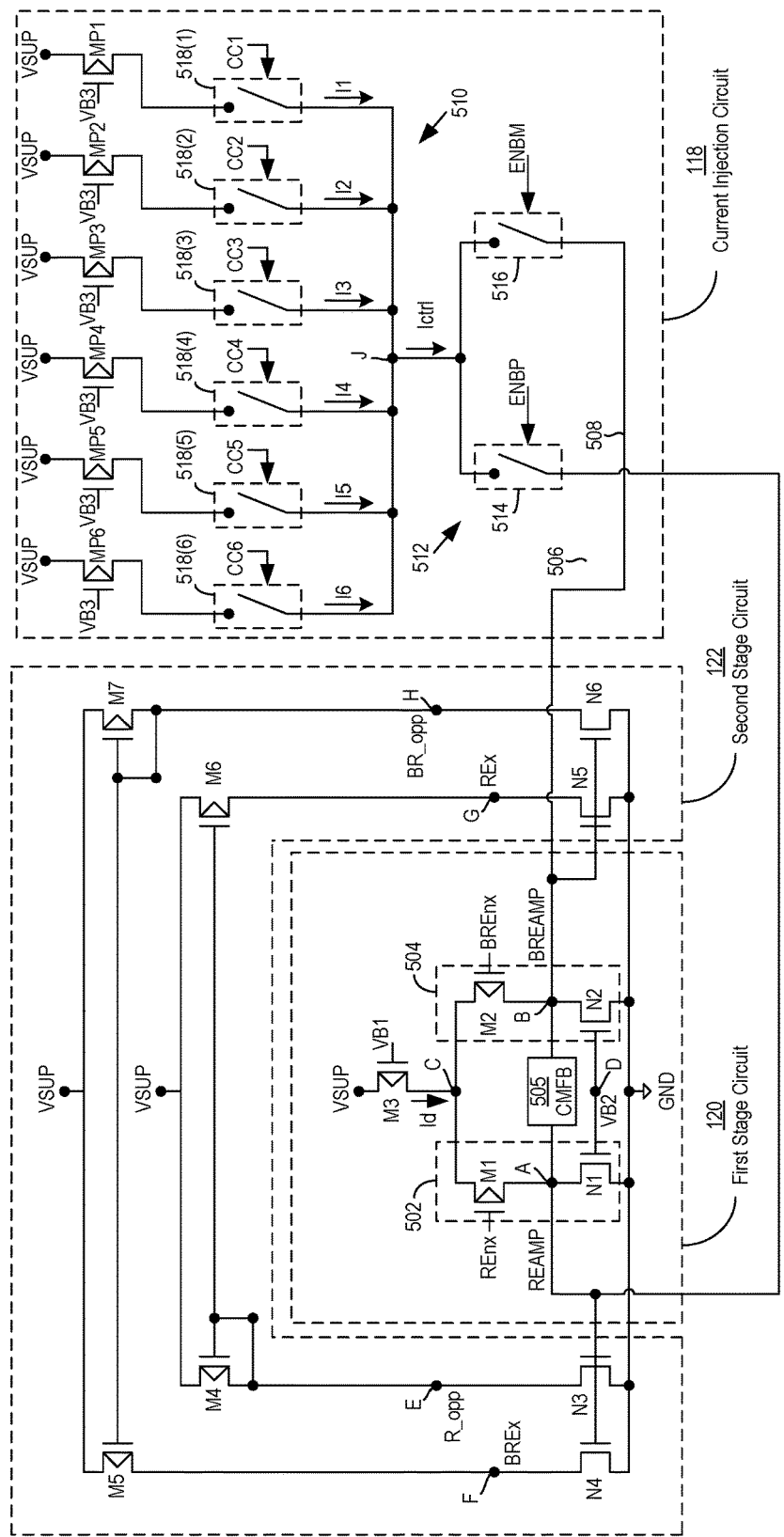
FIG. 5 is a circuit schematic of example configurations of a current injection circuit, and first and second stage circuits of an amplifier circuit of FIG. 1.

FIG. 5 shows a circuit schematic diagram of example configurations of the current injection circuit 118, and the first stage circuit 120, and the second stage circuit 122. The first stage circuit 120 is generally configured as a differential amplifier configured to receive the input signals REnx, BREnx. As shown in FIG. 5, the first stage circuit 120 includes the output nodes A and B, and is configured to generate the first pair of intermediate signals REAMP, BREAMP at the output nodes A, B, respectively. In addition, the first stage circuit 120 includes a pair of current branches 502, 504 through which a current Id may flow from a node C to ground (GND). The first branch 502 includes a first PMOS transistor M1 and a first NMOS transistor N1 connected to output node A. The second branch 504 includes a second PMOS transistor M2 and a second NMOS transistor N2 connected to output node B. The first stage circuit 120 also includes a third PMOS transistor M3 that has a source terminal connected to a supply voltage VSUP, a drain terminal connected to node C and a gate terminal configured to receive a first gate bias voltage VB1. In general, the first gate bias voltage VB1 is generated at a level to keep the third PMOS transistor M3 turned on so that the third PMOS transistor M3 supplies the current Id to node C. The first gate bias voltage VB1 may be generated by a voltage generator circuit (not shown) external or internal to the duty cycle correction circuit 100, and/or which may be located on a same chip or integrated circuit or a different chip or integrated circuit as the duty cycle correction circuit 100.

With respect to the first branch 502, the first PMOS transistor M1 has a gate terminal configured to receive the first input signal REnx, a drain terminal connected to node A where the first intermediate signal REAMP is generated, and a source terminal connected to node C. The first NMOS transistor N1 has a drain terminal connected to node A, a source terminal connected to ground, and a gate terminal connected to a node D, where a gate terminal of the second NMOS transistor N2 is also connected. With respect to the second branch 504, the second PMOS transistor M2 has a gate terminal configured to receive the second input signal BREnx, a drain terminal connected to node B where the second intermediate signal BREAMP is generated, and a source terminal connected to node C. The second NMOS transistor N2 has a drain terminal connected to node B, a source terminal connected to ground, and a gate terminal connected to the gate terminal of the first NMOS transistor N1 at node D.

In addition, the first stage circuit 120 includes a common-mode feedback circuit (CMFB) 505 connected to output node A and B, and configured to maintain common mode voltages of the first pair of intermediate signals REAMP, BREAMP. In some example configurations, the common-mode feedback circuit 505 may be configured to generate a second gate bias voltage VB2 at node D that biases the gate terminals of the first and second NMOS transistors N1, N2 at a level that turns on the first and second NMOS transistors N1, N2. In other example configurations, a separate voltage generator, external or internal to the duty cycle correction circuit 100, and/or located on a same chip or integrated circuit or a different chip or integrated circuit as the duty cycle correction circuit 100, may be configured to generate the second gate bias voltage VB2.

In operation, assume that at an initial or first point in time, the first input signal REnx is at an associated high voltage level (e.g., the high voltage level $V_{H1}$ in FIGS. 3A, 4A) and the second input signal BREnx is at an associated low voltage level (e.g., the low voltage level $V_{L1}$ in FIGS. 3A, 4A). In response, the first PMOS transistor M1 is turned off and the second PMOS transistor M2 is turned on. At this initial time, the current Id flowing through the third PMOS transistor M3 to node C flows through the second branch 504—i.e., through the second PMOS transistor M2, output node B, and the second NMOS transistor N2 to ground—instead of through the first branch 502.

The current Id being supplied to output node B may cause the second PMOS transistor M2 and the second NMOS transistor N2 to generate the second intermediate signal BREAMP at a positive voltage level. For example, the current Id may be configured to drive the voltage level of the second intermediate signal to the level of the supply voltage VSUP. Also, at this time, since no current is being supplied to node A via the first branch 502, the voltage level of the first intermediate signal REAMP at node A is 0 V.

In general, when the first input signal REnx is at its associated high level and the second input signal BREnx is at its associated low level, the first stage circuit 120 is configured to supply the current Id to output node B to cause the second PMOS transistor M2 and the second NMOS transistor N1 to drive the voltage of the second intermediate signal BREAMP to its associated high voltage level, while the first PMOS transistor M1 and the first NMOS transistor N1 operate to generate the first intermediate signal REAMP at its associated low voltage level, or 0 V.

Subsequently, at a second point in time following the initial time, the first input signal REnx may begin performing a falling transition and begin falling from its associated high voltage level to its associated low voltage level, and the second input signal BREnx may begin performing a rising transition and begin rising from its associated low voltage level to its associated high voltage level. At a third point in time shortly after the input signals REnx, BREnx begin performing their respective falling and rising transitions, the input signals REnx, BREnx may reach a threshold voltage level that turns on the first PMOS transistor M1, and turns off the second PMOS transistor M2. At this third point in time, the current Id flowing to node C now begins flowing through the first branch 502 to node A instead of through the second branch 504. In response, the first PMOS transistor M1 and the first NMOS transistor N1 of the first branch 502 start increasing the voltage level of the first intermediate signal REAMP to the high voltage level and the second PMOS transistor M2 and the second NMOS transistor N2 of the second branch 504 start decreasing the voltage level of the second intermediate signal BREAMP to the low voltage level, which is at or close to ground.

At a fourth point in time, the first input signal REnx may begin performing a rising transition and begin rising from its associated low level to its associated high level, and the second input signal BREnx may begin performing a falling transition and begin falling from its associated high level to its associated low level. At a fifth point in time shortly after the input signals REnx, BREnx begin performing their respective rising and falling transitions, the input signals REnx, BREnx may reach a threshold voltage level that turns off the first PMOS transistor M1, and turns on the second PMOS transistor M2. In response, the current Id may change to flowing through the second branch 504 to output node B. In turn, the first PMOS transistor M1 and the first NMOS transistor N1 may start decreasing the voltage level of the first intermediate signal REAMP from the high level to the low level, and the second PMOS transistor M2 and the second NMOS transistor N2 may start increasing the voltage level of the second intermediate signal BREAMP from the low level to the high level.

The first stage circuit 120 may continue to generate the first pair of intermediate signals REAMP, BREAMP at output nodes A, B at high and low voltage levels and transition the first pair of intermediate signals REAMP, BREAMP between the high and low voltage levels in response to the high and low voltage levels and the transitioning between the high and low voltage levels of the pair of input signals REnx, BREnx.

The second stage circuit 122 includes a third NMOS transistor N3, a fourth NMOS transistor N4, an fifth NMOS transistor N5, a sixth NMOS transistor N6, a fourth PMOS transistor M4, a fifth PMOS transistor M5, a sixth PMOS transistor M6, and a seventh PMOS transistor M7. The third NMOS transistor N3 has a gate terminal connected to output node A and configured to receive the first intermediate signal of the first pair REAMP. In addition, the third NMOS transistor N3 has a drain terminal connected to a node E where a voltage R_opp is generated, and a source terminal connected to ground. The fourth NMOS transistor N4 has a gate terminal also connected to output node A and configured to receive the first intermediate signal of the first pair REAMP. In addition, the fourth NMOS transistor N4 has a drain terminal connected to a node F where the second intermediate signal of the second pair BREx is generated, and a source terminal connected to ground. The fifth NMOS transistor N5 has a gate terminal connected to output node B and configured to receive the second intermediate signal of the first pair BREAMP. In addition, the fifth NMOS transistor N5 has a drain terminal connected to a node G where the first intermediate of the second pair REx is generated, and a source terminal connected to ground. The sixth NMOS transistor N6 has a gate terminal also connected to output node B and configured to receive the second intermediate signal of the first pair BREAMP. In addition, the sixth NMOS transistor N6 has a drain terminal connected to a node H where a voltage BR_opp is generated, and a source terminal connected to ground.

The fourth PMOS transistor M4 has a drain terminal connected to node E and to the drain of the third NMOS transistor N3, a source terminal connected to the supply voltage VSUP. In addition, the drain terminal of the fourth PMOS transistor M4 is connected to its gate terminal, and also connected to a gate terminal of the sixth PMOS transistor M6, forming a current mirror connection with the sixth PMOS transistor M6. In addition to having its gate terminal connected to the gate and drain terminals of the fourth PMOS transistor M4, the sixth PMOS transistor M6 also has a drain terminal connected to node G and to the drain terminal of the fifth NMOS transistor N5, and a source terminal connected to the supply voltage VSUP. The seventh PMOS transistor M7 has a drain terminal and a gate terminal connected together and to node H, and a source terminal connected to the supply voltage VSUP. In addition, the drain and gate terminals of the seventh PMOS transistor M7 are connected to a gate terminal of the fifth PMOS transistor M5, forming a current mirror connection with the fifth PMOS transistor M5. In addition to having its gate terminal connected to the gate and drain terminals of the seventh PMOS transistor M7, the fifth PMOS transistor M5 has source terminal connected to the supply voltage VSUP and a drain terminal connected to node F and to the drain of the fourth NMOS transistor N4.

In operation, referring back to the initial time, the first intermediate signal of the first pair REAMP being at its associated low voltage level and the second intermediate signal of the first pair BREAMP being at its associated high voltage level may cause the third and fourth NMOS transistors M3, M4 to each be turned off and the fifth and sixth NMOS transistors N5, N6 to each be turned on. In response to the third NMOS transistor N3 being turned off, the fourth PMOS transistor M4 will also be turned off, and so the level of the voltage R_opp at node E will be equal to the supply voltage level VSUP. Also, because the gate and drain terminals of the fourth PMOS transistor M4 connected to node E are also connected to the gate terminal of the sixth PMOS transistor M6, then the sixth PMOS transistor M6 will be turned off. Accordingly, at the initial time, with the sixth PMOS transistor M6 turned off and the fifth NMOS transistor N5 turned on, the voltage level of the first intermediate signal of the second pair REx at node G will be at its associated low voltage level, which is at or close to ground. In addition, in response to the sixth NMOS transistor N6 turned on, the sixth NMOS transistor N6 will pull down the voltage BR_opp at node H to a level at or close to ground. With the voltage BR_opp at a low level, the seventh PMOS transistor M7 may turn on, operating as a current source that sources current to node H and the sixth NMOS transistor M6. In addition, with the fourth NMOS transistor N4 turned off, the fifth PMOS transistor M5 will also be turned off, and so the level of the second intermediate signal of the second pair BREx will be at its associated high voltage level, which is at or close to the supply voltage VSUP.

As previously described, in response to the first input signal REnx performing a falling transition and the second input signal BREnx performing a rising transition, the input signals may reach a threshold voltage level that causes the first PMOS transistor M1 and the first NMOS transistor N1 to increase the voltage level of the first intermediate signal of the first pair REAMP from the associated low voltage level to the associated high voltage level, and cause the second PMOS transistor M2 and the second NMOS transistor N2 to decrease the voltage level of the second intermediate signal of the first pair BREAMP from the associated high level to the associated low level. At some point shortly after the first intermediate signal REAMP begins increasing and the second intermediate signal BREAMP begins decreasing, a cross-point may occur in that their voltages may reach the same voltage level. At this point, the first intermediate signal REAMP may have risen to a voltage level that turns on the third NMOS transistor N3 and the fourth NMOS transistor N4, and the second intermediate signal BREAMP may have fallen to a voltage level that turns off the fifth NMOS transistor N5 and the sixth NMOS transistor N6. In response to the fifth NMOS transistor N5 turning off, the fifth NMOS transistor N5 and the sixth PMOS transistor M6 may transition the voltage of the first intermediate signal of the second pair REx at node G from the associated low level to the associated high level, which is at or close to the supply voltage VSUP. Also, with the sixth NMOS transistor N6 turned off, the sixth NMOS transistor N6 and the seventh PMOS transistor M7 generates the voltage BR_opp at a high level, which in turn turns off the fifth PMOS transistor M5. In addition, with the fourth NMOS transistor N4 turned on, the fourth NMOS transistor N4 may pull down the voltage of the second intermediate signal of the second pair BREx to the associated low voltage level, which is at or close to ground. In sum, shortly after the first intermediate signal of the first pair REAMP begins performing a rising transition and the second intermediate signal of the first pair BREAMP begins performing a falling transition, a cross-point occurs, causing the fifth NMOS transistor N5 and the sixth PMOS transistor M6 to transition the first intermediate signal of the second pair REx from the associated low level to the associated high level, and causing the fourth NMOS transistor N4 and the fifth PMOS transistor M5 to transition the second intermediate signal of the second pair BREx from the associated high level to the associated low level.

Subsequently, in response to the first input signal REnx performing a rising transition and the second input signal BREnx performing a falling transition, the input signals may reach a threshold voltage level that causes the first PMOS transistor M1 and the first NMOS transistor N1 to decrease the voltage level of the first intermediate signal of the first pair REAMP from the associated high voltage level to the associated low voltage level, and cause the second PMOS transistor M2 and the second NMOS transistor N2 to increase the voltage level of the second intermediate signal of the first pair BREAMP from the associated low level to the associated high level.

At some point shortly after the first intermediate signal REAMP begins decreasing and the second intermediate signal BREAMP begins increasing, a cross-point may occur in that their voltages may reach the same voltage level. At this point, the first intermediate signal REAMP may have fallen to a voltage level that turns off the third NMOS transistor N3 and the fourth NMOS transistor N4, and the second intermediate signal BREAMP may have risen to a voltage level that turns on the fifth NMOS transistor N5 and the sixth NMOS transistor N6. In response to the fourth NMOS transistor N4 turning off, the fourth NMOS transistor N4 and the fifth PMOS transistor M5 may transition the voltage of the second intermediate signal of the second pair BREx at node F from the associated low level to the associated high level, which is at or close to the supply voltage VSUP. Also, with the third NMOS transistor N3 turned off, the third NMOS transistor N3 and the fourth PMOS transistor M4 may generate the voltage R_opp at a high level, which in turn turns off the sixth PMOS transistor M6. In addition, with the fifth NMOS transistor N5 turned on, the fifth NMOS transistor N5 may pull down the voltage of the first intermediate signal of the second pair REx to the associated low voltage level, which is at or close to ground. In sum, shortly after the first intermediate signal of the first pair REAMP begins performing a falling transition and the second intermediate signal of the first pair BREAMP begins performing a rising transition, a cross-point occurs, causing the fifth NMOS transistor N5 and the sixth PMOS transistor M6 to transition the first intermediate signal of the second pair REx from the associated high level to the associated low level, and causing the fourth NMOS transistor N4 and the fifth PMOS transistor M5 to transition the second intermediate signal of the second pair BREx from the associated low level to the associated high level.

Referring again to the first stage circuit 120, when the control current Ictrl is not injected into the first stage circuit 120, the first and second branches 502, 504 may generate their respective intermediate signals REAMP, BREAMP with the same amount of gain. Here, the gain that the first branch 502 has to generate the first intermediate signal REAMP is equal to the difference between the high voltage level and the low voltage level of the first intermediate signal REAMP divided by the difference between the high voltage level and the low voltage level of the first input signal REnx. Similarly, the gain that the second branch 504 has to generate the second intermediate signal BREAMP is equal to the difference between the high voltage level and the low voltage level of the second intermediate signal BREAMP divided by the difference between the high voltage level and the low voltage level of the second input signal BREnx.

The gain with which a branch of the first stage circuit 120 has to generate a respective one of the intermediate signals REAMP, BREAMP is directly proportional to the product of the transconductance of the PMOS transistor of the branch and the output resistance of the NMOS transistor of the branch. Accordingly, the gain of the first branch 502 is proportional to the product of the transconductance of the first PMOS transistor M1 and the output resistance of the first NMOS transistor N1. Likewise, the gain of the second branch 504 is proportional to the product of the transconductance of the second PMOS transistor M2 and the output resistance of the second NMOS transistor N2.

Further, the output resistance of an NMOS transistor of a branch changes in response to the amount of current flowing through the NMOS transistor, and in particular is inversely proportional to the amount of the current flow. So, the output resistance decreases as the amount of current increases, and the output resistance increases as the amount of current decreases. As previously described, when the first PMOS transistor M1 is turned on, the amount of current flowing through the first NMOS transistor N1 is the current Id, and when the second PMOS transistor M2 is turned on, the amount of current flowing through the second NMOS transistor N2 is the current Id. Since the amount of the current flowing through each of the first and second NMOS transistors N1, N2 when no control current Ictrl is injected is the same, then when no control current Ictrl is injected into the first stage circuit 120, the first branch 502 and the second branch 504 are configured to generate their respective intermediate signals REAMP, BREAMP with the same amount of gain.

Alternatively, when the control current Ictrl is injected into one of the output nodes A, B, the amount of current flowing through each of the first and second NMOS transistors N1, N2 is different. In the event that the control current Ictrl is injected into output node A, then the amount of current flowing through the first NMOS transistor N1 when the first PMOS transistor M1 is turned on is equal to the sum of the current Id and the control current Ictrl, which is a greater amount than the current flowing through the second NMOS transistor N2, which is still the current Id. Because more current is flowing through the first NMOS transistor N1 than the through second NMOS transistor N2 when the control current Ictrl is injected into output node A, then the output resistance of the first NMOS transistor N1 is lower compared to the output resistance of the second NMOS transistor N2. As such, when the control current Ictrl is injected into output node A, the first branch 502 has less gain with which to generate the first intermediate signal REAMP compared to the gain with which the second branch 504 has to generate the second intermediate signal BREAMP. The amount that the first branch's 502 gain is decreased is proportional to the amount of the control current Ictrl. So, as the amount of the control current Ictrl increases, the gain of the first branch 502 correspondingly decreases, and as the amount of the control current Ictrl decreases, the gain of the first branch 502 correspondingly increases. Similarly, in the event that the control current Ictrl is injected into output node B, then the amount of current flowing through the second NMOS transistor N2 when the second PMOS transistor M2 is turned on is equal to the sum of the current Id and the control current Ictrl, which is a greater amount than the current flowing through the first NMOS transistor N1, which is still the current Id. Because more current is flowing through the second NMOS transistor N2 than the through first NMOS transistor N1 when the control current Ictrl is injected into output node B, then the output resistance of the second NMOS transistor N2 is lower compared to the output resistance of the first NMOS transistor N1. As such, when the control current Ictrl is injected into output node B, the second branch 504 has less gain with which to generate the second intermediate signal BREAMP compared to the gain with which the first branch 502 has to generate the first intermediate signal REAMP. The amount that the second branch's 504 gain is decreased is proportional to the amount of the control current Ictrl. So, as the amount of the control current Ictrl increases, the gain of the second branch 504 decreases, and as the amount of the control current Ictrl decreases, the gain of the second branch 504 increases.

Additionally, when one of the first or second branches 502, 504 generates its respective intermediate signal REAMP, BREAMP with a reduced amount of gain, the overall differential gain output by the first and second branches 502, 504 is reduced.

In addition, the common mode voltage of an intermediate signal may be equal to the gate-to-source voltage Vgs of the NMOS transistor connected to the output node at which the intermediate signal is generated. So, the common mode voltage CM_R of the first intermediate signal REAMP is equal to the gate-to-source voltage Vgs1 of the first NMOS transistor N1, and the common mode voltage CM_BR of the second intermediate signal BREAMP is equal to the gateto-source voltage Vgs2 of the second NMOS transistor N2. The gate-to-source voltage Vgs of a given NMOS transistor is directly proportional to the amount of current flowing through the NMOS transistor. In turn, the common mode voltage CM_R of the first intermediate signal REAMP is directly proportional to the amount of current flowing through the first NMOS transistor N1, and the common mode voltage CM_BR of the second intermediate signal BREAMP is directly proportional to the amount of current flowing through the second NMOS transistor N2.

As previously described, when the control current Ictrl is not injected into either output node A or output node B, the amount of current flowing through each of the first and second NMOS transistors N1, N2 is the same. Accordingly, when the control current Ictrl is not injected into either output node A or output node B, the first branch 502 and the second branch 504 respectively generate the first and second intermediate signals REAMP, BREAMP with the same common mode voltage.

Alternatively, when the control current Ictrl is injected into output node A, the total amount of current flowing through the first NMOS transistor N1 increases, which in turn increases the gate-to-source voltage Vgs1 of the first NMOS transistor N1, and the common mode voltage CM_R of the first intermediate signal REAMP correspondingly increases. Accordingly, injection of the control current Ictrl into output node A increases the common mode voltage CM_R compared to if the control current Ictrl is not injected into output node A, and the amount by which the common mode voltage CM_R increases is directly proportional to the amount of the control current Ictrl. In addition, as the amount of the control current Ictrl increases, the level of the common mode voltage CM_R of the first intermediate signal REAMP correspondingly increases, and as the amount of the control current Ictrl decreases, the level of the common mode voltage CM_R of the first intermediate signal REAMP correspondingly decreases. Similarly, when the control current Ictrl is injected into output node B, the total amount of current flowing through the second NMOS transistor N2 increases, which in turn increases the gate-to-source voltage Vgs2 of the second NMOS transistor N2, and the common mode voltage CM_BR of the second intermediate signal BREAMP correspondingly increases. Accordingly, injection of the control current Ictrl into output node B increases the common mode voltage CM_BR compared to if the control current Ictrl is not injected into output node A, and the amount by which the common mode voltage CM_BR increases is directly proportional to the amount of the control current Ictrl. In addition, as the amount of the control current Ictrl increases, the level of the common mode voltage CM_BR of the second intermediate signal BREAMP correspondingly increases, and as the amount of the control current Ictrl decreases, the level of the common mode voltage CM_BR of the second intermediate signal BREAMP correspondingly decreases.

Referring now to the current injection circuit 118, the current injection circuit 118 may be connected to output nodes A, B of the first stage circuit 120 via a first control current path 506 and a second control current path 508. In particular, the current injection circuit 118 may be configured to inject the control current Ictrl to output node A via the first control current path 506 and inject the control current Ictrl to output node B via the second control current path 508.

The current injection circuit 118 may include a current generation circuit 510 that is configured to generate the control current Ictrl. The current generation circuit 510 may be configured to supply the control current Ictrl to switching circuitry 512 that is configured to alternatingly supply or inject the control current Ictrl to output node A via the first current control path 506 or to output node B via the second current control path 508. In particular, the switching circuitry 512 may include a first switch 514 that is configured to supply the control current Ictrl to output node A and a second switch 516 that is configured to supply the control current Ictrl to output node B. Each of the first and second switches 514, 516 may have an input coupled to a node J where the current generation circuit 510 generates the control current Ictrl. In addition, the first switch 514 may have an output connected to the first control current path 506, and the second switch 516 may have an output connected to the second control current path 508. The first switch 514 and the second switch 516 may alternatingly supply or inject the control current Ictrl to output node A and output node B, respectively. So, when the first switch 514 is closed, the second switch 516 is open, and the first switch 514 may inject the control current Ictrl into output node A. Alternatively, when the second switch 516 is closed, the first switch 514 is open, and the second switch 516 may inject the control current Ictrl into output node B.

The current generation circuit 510 may include a plurality of parallel-connected current source circuits, each configured to generate a respective one of a plurality of currents. The example configuration shown in FIG. 5 includes six current source circuits, although other numbers more or fewer than six may be possible. In still other example configurations, the current generation circuit 510 may include a single current source circuit, and the current generated by the single current source circuit is the control current Ictrl.

The example six current source circuit configuration shown in FIG. 5 includes a first current source circuit configured to generate and output a first current I1, a second current source circuit configured to generate and output a second current I2, a third current source circuit configured to generate and output a third current I3, a fourth current source circuit configured to generate and output a fourth current I4, a fifth current source circuit configured to generate and output a fifth current I5, and a sixth current source circuit configured to generate and output a sixth current I6. Each current source circuit may include a switch connected in series with a PMOS transistor that is configured to generate a current with the switch is closed. So, in the example six current source circuit configuration shown in FIG. 5, the first current source circuit includes a first PMOS transistor MP1 connected in series with a first switch 518(1); the second current source circuit includes a second PMOS transistor MP2 connected in series with a second switch 518(2); the third current source circuit includes a third PMOS transistor MP3 connected in series with a third switch 518(3); the fourth current source circuit includes a fourth PMOS transistor MP4 connected in series with a fourth switch 518(4); the fifth current source circuit includes a fifth PMOS transistor MP5 connected in series with a fifth switch 518(5); and the sixth current source circuit includes a sixth PMOS transistor MP6 connected in series with a sixth switch 518(6).

For each current source circuit, when the associated switch is closed, the associated PMOS transistor is configured to generate the respective current and the switch is configured output the respective output current. Alternatively, when the associated switch is open, the associated switch does not output the respective current. So, for the first current source circuit, when the first switch 518(1) is closed, the first PMOS transistor MP1 generates the first current I1 and the first switch 518(1) outputs the first current I1. Alternatively, when the first switch 518(1) is open, the first switch 518(1) does not output the first current I1. For the second current source circuit, when the second switch 518(2) is closed, the second PMOS transistor MP2 generates the second current I2 and the second switch 518(2) outputs the second current I2. Alternatively, when the second switch 518(2) is open, the second switch 518(2) does not output the second current I2. For the third current source circuit, when the third switch 518(3) is closed, the third PMOS transistor MP3 generates the third current I3 and the third switch 518(3) outputs the third current I3. Alternatively, when the third switch 518(3) is open, the third switch 518(3) does not output the third current I3. For the fourth current source circuit, when the fourth switch 518(4) is closed, the fourth PMOS transistor MP4 generates the fourth current I4 and the fourth switch 518(4) outputs the fourth current I4. Alternatively, when the fourth switch 518(4) is open, the fourth switch 518(4) does not output the fourth current I4. For the fifth current source circuit, when the fifth switch 518(5) is closed, the fifth PMOS transistor MP5 generates the fifth current I5 and the fifth switch 518(5) outputs the fifth current I5. Alternatively, when the fifth switch 518(5) is open, the fifth switch 518(5) does not output the fifth current I5. For the sixth current source circuit, when the sixth switch 518(6) is closed, the sixth PMOS transistor MP6 generates the sixth current I6 and the sixth switch 518(6) outputs the sixth current I6. Alternatively, when the sixth switch 518(6) is open, the sixth switch 518(6) does not output the sixth current I6. A current source circuit with its switch closed is referred to as being activated, and a current source circuit with its switch open is referred to as being deactivated.

Each of the current source circuits may be configured to output their respective currents to an output node J that is connected to the switching circuitry 512. The control current Ictrl may be generated at node J, and at any given point in time, the control current Ictrl is the sum of a given combination of zero, one, two, three, four, five, or all six of the six currents I1 to I6 being output by the current source circuits. As an example, at a given point in time, if the first current source circuit is outputting the first current I1 and the sixth current source circuit is outputting the sixth current, while the second through fifth currents source are not outputting their respective currents I2 to I5, then the amount of the control current Ictrl is the sum of the first current I1 and the sixth current I6.

As shown in FIG. 5, each of the six PMOS transistors MP1 to MP6 may receive at their respective gate terminals a third gate bias voltage VB3 that may be generated at a level that turns on the PMOS transistors MP1 to MP6. This way, when a respective switch is closed, the associated PMOS transistor is turned on to generate its respective current. Also, for some example configurations, each of the current source circuits may be configured to generate their respective currents I1 to I6 at the same level or amount, while in other example configurations, two or more of the current source circuits may be configured to generate their respective currents I1 to I6 at different levels or amounts. The third gate bias voltage VB3 may be generated by a voltage generator circuit (not shown) that is external or internal to the duty cycle correction circuit 100, and which may be located on a same chip or integrated circuit or a different chip or integrated circuit as the duty cycle correction circuit 100.

Referring also to FIG. 1, the search circuit 116 may be configured to control the operation of current injection circuit 118 during the duty cycle correction process in order for the current injection circuit 118 to inject the control current Ictrl into either output node A or output node B and at an optimal amount for the duty cycles of the output signals DQS, BDQS to be as closely matched as possible and/or to be as close as possible to the predetermined duty cycle. To control whether the control current Ictrl is injected into output node A or output node B, the search circuit 116 may be configured to output a first control signal ENBP to the first switch 514 to control whether the first switch 514 is open or closed, and to send a second control signal ENBM to the second switch 516 to control whether the second switch 514 is open or closed. For example, if the search circuit 116 determines to inject the control current Ictrl into output node A, the search circuit 116 may output the first and second control signals ENBP, ENBM at appropriate levels so that the first switch 514 is closed and the second switch 516 is open. Alternatively, if the search circuit 116 determines to inject the control current Ictrl into output node B, the search circuit 116 may output the first and second control signals ENBP, ENBM at appropriate levels so that the first switch 514 is open and the second switch 516 is closed.

In addition, in order to control the amount of the control current Ictrl, the search circuit 116 may be configured to control which of the switches 518(1) to 518(6) are to be closed and which are to be open so that the current generation circuit 510 generates the control current Ictrl at the amount determined by the search circuit 116. In particular, the search circuit 116 may further be configured to output current control signals CC1 to CC6 to control whether each of the switches 518(1) to 518(6) are open or closed. That is, the search circuit 116 may be configured to output a first current control signal CC1 to the first switch 518(1) that controls whether the first switch 518(1) is open or closed, a second current control signal CC2 to the second switch 518(2) that controls whether the second switch 518(2) is open or closed, a third current control signal CC3 to the third switch 518(3) that controls whether the third switch 518(3) is open or closed, a fourth current control signal CC4 to the fourth switch 518(4) that controls whether the fourth switch 518(4) is open or closed, a fifth current control signal CC5 to the fifth switch 518(5) that controls whether the fifth switch 518(5) is open or closed, and a sixth current control signal CC6 to the sixth switch 518(6) that controls whether the sixth switch 518(6) is open or closed. The current control signals CC1 to CC6 are denoted collectively at "CC" in FIG. 1.

For some example configurations, the search circuit 116 may be configured to search for and/or identify an n-bit binary number that identifies a current amount for the control current Ictrl. For such example configurations, because an n-bit binary number can be one of $2^n$ possible binary values, each of the $2^n$ binary values may correspond to and/or represent a unique current amount for the control current Ictrl. In addition, as the current generation circuit 510 may include an m-number of current source circuits, the current source circuits can be configured to be in $2^n$ different possible combinations of being activated and deactivated. The current generation circuit 510 may be configured to generate a unique amount of the control current Ictrl for each unique combination of activated current source circuits. Accordingly, the n-number of bits of the binary number may be equal to the m-number of current source circuits, and each unique n-bit binary value may uniquely correspond to a unique current amount at which a unique combination of activated current source circuits is configured to generate the control current Ictrl.

In response to selecting an n-bit binary number with a particular binary value, the search circuit 116 may be configured to identify the unique combination of which of the switches 518(1) to 518(6) are to be closed and which are to be open. The search circuit may then output the current control signals CC1 to CC6 to configure the switches 518(1) to 518(6) in that unique combination. In turn, the current generation circuit 510 is configured to generate the control current Ictrl at the unique amount corresponding to the particular n-bit binary value that the search circuit 116 selected.

For at least some these configurations where the search circuit 116 identifies n-bit binary numbers to select the current amounts, the magnitudes of the unique current amounts relative to each other may directly correspond to their associated n-bit binary values, such that a higher binary value selected by the search circuit 116 results in the current injection circuit 118 injecting a larger amount of control current Ictrl into the first stage circuit 120. In other example configurations, the magnitudes of the unique current amounts relative to each other may indirectly correspond to their associated n-bit binary values, such that a higher binary value selected by the search circuit 116 results in the current injection circuit 118 injecting a smaller amount of the control current Ictrl into the first stage circuit 120.

In addition, for at least some of the configurations where the search circuit 116 identifies n-bit binary numbers to select the current amounts, each bit or binary digit of the binary number may correspond to one of the current source circuits and/or one of the currents generated by the current source circuits. For example, with respect to the configuration in FIG. 5, each bit of the n-bit digital value may correspond to one of the six current source circuits and/or one of the six currents used to generate the control current Ictrl. So, a first bit may correspond to the first current source circuit and/or the first current I1, a second bit may correspond to the second current source circuit and/or the second current I2, a third bit may correspond to the third current source circuit and/or the third current I3, a fourth bit may correspond to the fourth current source circuit and/or the fourth current I4, a fifth bit may correspond to the fifth current source circuit and/or the fifth current I5, and a sixth bit may correspond to the sixth current source circuit and/or the sixth current I6. For these configurations, each bit may have a logic 0 value or a logic 1 value, with each logic value identifying whether the associated switch is open or closed. For example, the logic 0 value may indicate that the associated switch is to be open and the logic 1 value may indicate that the associated switch is to be closed. For some example configurations, the n-bit value may be part of a larger (n+1)-bit value or an (n+2)-bit value, where the extra bit(s) may indicate whether each of the first and second switches 514, 516 are to be open or closed.

For at least some of the configurations where each bit of the n-bit binary number corresponds to a respective current source circuit, the current source circuits may be configured to generate their respective currents at relative magnitudes such that the magnitudes of the unique current amounts relative to each other directly correspond to their associated n-bit binary values. To illustrate, consider four 3-bit binary values: "001" "010" "011" and "100." The binary value "001" may correspond to the first current source circuit being activated to output the first current I1, and the second and third current source circuits being deactivated; the binary value "010" may correspond to the second current source being activated to output the second current I2, and the first and third current source circuits being deactivated; the binary value "011" may correspond to the first and second current source circuits being activated to output the sum of the first and second currents I1 and I2, and the third current source circuit being deactivated; and the binary value "100" may correspond to the third current source being activated to output the third current I3, and the first and second current source circuits being deactivated. The second current source circuit may be configured to generate the second current I2 at a higher magnitude than the first current source circuit is configured to generate the first current I1 in order to correspond to the binary value "010" being higher than the binary value "001." Likewise, the third current source may be configured to generate the third current I3 at a higher magnitude than the sum of the first and second currents I1, I2 to correspond to the binary value "100" being higher than the binary value "011." Such configurations may ensure that when the selection circuit 116 selects a higher binary value, the current injection circuit 118 injects a higher amount of the control current Ictrl, and when the selection circuit 116 selects a lower binary value, the current injection circuit 118 injects a lower amount of the control current Ictrl. For other example configurations, the current source circuits may be configured to generate their respective currents at relative magnitudes such that the magnitudes of the unique current amounts relative to each other indirectly correspond to their associated n-bit binary values. This way, when the selection circuit 116 selects a higher binary value, the current injection circuit 118 injects a lower amount of the control current Ictrl, and when the selection circuit 116 selects a lower binary value, the current injection circuit 118 injects a higher amount of the control current Ictrl.

As previously described, the duty cycle correction circuit 100 may be configured to perform the duty cycle correction process over an N-number of iterations. During each iteration, the search circuit 116 may be configured to determine whether the control current Ictrl is to be injected into output node A or output node B, an amount of the control current Ictrl, or both. In response to the determination, the search circuit 116 may be configured to output the first control signal ENBP to the first switch 514, the second control signal ENBM to the second switch 516, and the current control signals CC1 to CC6 to the switches 516(1) to 516(6) at appropriate levels so that the control current Ictrl is injected into the determined output node at the determined amount.

In a particular example duty cycle correction process, the search circuit 116 may first determine whether to inject the control current Ictrl into output node A or output node B in order to optimally match the duty cycles of the output signals DQS, BDQS. In other words, the search circuit 116, in order to correct for duty cycle mismatch between the first and second output signals DQS, BDQS, may select whether to inject the control current Ictrl into output node A to decrease the gain and increase the common mode voltage CM_R of the first intermediate signal REAMP, or to inject the control current Ictrl into output node B to decrease the gain and increase the common mode voltage CM_BR of the second intermediate signal BREAMP. Upon making the selection, the search circuit 116 may search for an amount of the control current Ictrl to inject into the selected output node in order to correct the duty cycle mismatch. In a particular implementation, the search circuit 116 may select whether to inject the control current Ictrl into output node A or output node A and inject an initial amount of the control current Ictrl into that selected output node in a first of the N-number of iterations. Subsequently, over the 2nd through Nth iterations, the search circuit 116 may search for new current amounts for the control current Ictrl and/or adjust the amount of the control current Ictrl being injected into the selected output node to obtain an optimum current amount that corrects duty cycle mismatch between the output signals DQS, BDQS.

The search circuit 116 may utilize the levels of the comparison result signal CR to select whether to inject the control current Ictrl into output node A or output node B and also how to search for and/or select current amounts for the control current Ictrl. During the first iteration, the search circuit 116 may identify whether the duty cycle of the first output signal DQS or the duty cycle of the second output signal BDQS has the higher duty cycle. Based on which one is higher, the search circuit 116 may select whether to inject the control current Ictrl into output node A or output node B. In a particular example implementation, if the duty cycle of the first output signal DQS is higher than the duty cycle of the second output signal BDQS, as indicated by the comparison result signal CR, the search circuit 116 may select to inject the control current Ictrl into output node B to reduce the gain and increase the common mode voltage CM_BR of the second intermediate signal BREAMP since doing so reduces the duty cycle of the first output signal DQS and increases the duty cycle of the second output signal BDQS. Alternatively, if the duty cycle of the second output signal BDQS is higher than the duty cycle of the first output signal DQS, as indicated by the comparison result signal CR, the search circuit 116 may select to inject the control current Ictrl into output node A to reduce the gain and increase the common mode voltage CM_R of the first intermediate signal REAMP since doing so reduces the duty cycle of the second output signal BDQS and increases the duty cycle of the first output signal DQS. As mentioned, during the first iteration, the search circuit 116 may also set the amount of the control current Ictrl to an initial amount.

Thereafter, the search circuit 116 may monitor the relative levels of the duty cycles of the output signals DQS, BDQS, as indicated by the level of the comparison result signal CR, to determine whether and/or how to adjust the amount of the control current Ictrl injected into the selected output node. In a particular example implementation, during the 2nd through Nth iterations, if the search circuit 116 detects that the level of the comparison result signal CR has changed from the level it was in the first iteration, then the search circuit 116 may determine that it has overcompensated for the duty cycle mismatch and has injected too much current into the selected node—i.e., the amount of the control current Ictrl is too high. In response, the search circuit 116 may search for and/or select a lower amount for the control current Ictrl to inject into the selected output node. Alternatively, if the level of the comparison result signal CR is the same as it was in the first iteration, then the search circuit 116 may determine that it has not sufficiently compensated for the duty cycle mismatch and has not injected enough current into the selected node—i.e., the amount of the control current Ictrl is too low. In response, the search circuit 116 may search for and/or select a higher amount for the control current Ictrl to inject into the selected output node.

To illustrate, suppose during an initial iteration of a given duty cycle correction process, the search circuit 116 determines to inject the control current Ictrl into output node B because the comparison result signal CR is at its high level indicating that the duty cycle of the first output signal DQS is higher than the duty cycle of the second output signal BDQS. If, during one of the subsequent 2nd through Nth iterations, the search circuit 116 detects that the duty cycle of the first output signal DQS is still higher than the duty cycle of the second output signal BDQS because the comparison result signal CR is at its high level—i.e., the same level it was in the first iteration—then the search circuit 116 may determine that it has not sufficiently compensated for the duty cycle mismatch between the output signals DQS, BDQS. In response, the search circuit 116 may search for and/or select a higher amount for the control current Ictrl to inject into output node B. Alternatively, if during one of the subsequent 2nd through Nth iterations, the search circuit 116 detects that the duty cycle of the first output signal DQS is lower than the duty cycle of the second output signal BDQS because the comparison result signal has changed—i.e., it is now at its low level instead of its high level—then the search circuit 116 may determine that it has overcompensated for the duty cycle mismatch between the output signals DQS, BDQS. In response, the duty search circuit 116 may search for and/or select a lower amount for the control current Ictrl to inject into output node B.

In addition, for some example configurations, during each of the iterations, the search circuit 116 may be configured to search for and/or select a target current amount of the control current Ictrl from an array or listing of a plurality of possible target current amounts for the control current Ictrl. That is, each element in the array may correspond to and/or indicate a current amount for the control current Ictrl. The search circuit 116 may include a memory that stores the array. In addition or alternatively, the search circuit 116 may be configured to search for and/or select an amount of the control current Ictrl according a search algorithm. The search algorithm may set forth one or more criterion, rules, or steps that the search circuit 116 is to use and/or follow in order to search for and/or select an amount of the control current Ictrl. The search circuit 116 may be configured to execute the search algorithm to determine a final current amount for the control current Ictrl by the last or Nth iteration of the duty cycle correction process.

The one or more criterion or rules may instruct or indicate to the search circuit 116 where to search for the next current amount and/or what current amount to select next in response to the level of the comparison result signal CR being high or low. During a given iteration, the search circuit 116 may identify whether the level of the comparison result signal CR is high or low. In response to the identification, and according the search algorithm, the search circuit 116 may select a next current amount for the control current Ictrl. Upon selecting the current amount, the search circuit 116 may output the current control signals CC1 to CC6 so that the current generation circuit 510 generates the control current Ictrl at the selected amount.

For at least some of these configurations, the search algorithm that the search circuit 116 executes is a binary search algorithm. In accordance with a binary search algorithm, during each iteration, the search circuit 116 may be configured to access an array, such as a sorted array, of possible current amounts for the control current Ictrl and select one of the possible current amounts as a target current amount for which to set the control current Ictrl. In each iteration, in order to make the selection, the search circuit 116 may determine an available portion of the array that includes one or more possible current amounts that are available to be selected, and select one of the possible current amounts in the available portion as the target current amount. In a particular example implementation, the search circuit 116 selects the middle current amount in the available portion as the target current amount.

For each iteration, an available portion of the array includes a minimum current amount and a maximum current amount, with the middle current amount being a middle value in between the minimum current amount and the maximum current amount. The minimum current amount may set a floor of the available portion and the maximum current amount may set a ceiling of the available portion. Accordingly, over the N-number of iterations, the search circuit 116 may set and/or adjust the floor and ceiling current amounts and search within the floor and ceiling amounts until the search circuit 116 selects a final current amount in the last or Nth iteration.

In the first iteration, the available portion may be the entire array, and so the minimum current amount of the available portion is the minimum current amount of the array, the maximum current amount of the available portion is the maximum current amount of the array, and the target current amount that the search circuit 116 selects is the middle current amount of the array. Accordingly, in the first iteration, the search circuit 116 selects the middle current amount of the array as the target current amount, and outputs the current control signals C1 to C6 so that the current generation circuit 510 outputs the control current Ictrl at the middle current amount of the array.

When the duty cycle correction process exits a prior iteration and begins a present iteration, the search circuit 116 will have established a present available portion of the array that includes a present maximum current amount, a present minimum amount, and a present target current amount. When the duty cycle correction process enters into a next iteration, which can be any of the 2nd through Nth iterations, the search circuit 116 may identify whether a present level of the comparison result signal CR is at its high level or low level, and whether the present level is different than the initial level of the comparison result signal CR. The present level is the level of the comparison result signal CR that the search circuit 116 identifies in a present or current iteration. The initial level is the level of the comparison result signal CR that the search circuit 116 identified in the first iteration.

In response to the determination of whether the present level is the same or different than the initial level, the search circuit 116 may establish a new available portion of the array and select a new current amount for the control current Ictrl in the new available portion. The search circuit 116 may establish a new available portion by setting a new maximum current amount (ceiling) or a new minimum current amount (floor), while keeping the other maximum or minimum current amount at its present amount. In response to the present level being the same as the initial level, the search circuit 116 may determine that it has not sufficiently compensated for the duty cycle mismatch, and in response determine to increase the amount of the control current Ictrl. Accordingly, the search circuit 116 may establish the new available portion by setting the present target current amount as the new minimum current amount and setting the present maximum current amount as the new maximum current amount. Alternatively, in response to the present level being different than the initial level, the search circuit 116 may determine that it has overcompensated for the duty cycle mismatch, and in response determine to decrease the amount of the control current Ictrl. Accordingly, the search circuit 116 may establish the new available portion by setting the present target current amount as the new maximum current amount and setting the present minimum current amount as the new minimum current amount. The portions of the present available portion that is excluded from new available portion becomes part of an unavailable portion of the array.

Upon establishing the new available portion, the search circuit 116 may select a new target current amount in the new available portion. The new target current amount that the search circuit 116 selects may be a middle current amount in between the new maximum current amount and the new minimum current amount. Upon selecting a new target current amount in the new available portion, the search circuit 116 may output the current control signals CC1 to CC6 to the switches 518(1) to 518(6) so that the current generation circuit 510 generates the control current Ictrl at the new target current amount.

The new available portion, along with the new maximum current amount, the new minimum current amount, and the target current amount, may be considered the present values when the duty cycle correction process enters into a new or next iteration. The search circuit 116 may proceed in this manner until it completes the N-number of iterations.

As previously described, for some example configurations, the search circuit 116 may be configured to search for and/or identify an n-bit digital value that identifies a current amount for the control current Ictrl and that identifies whether each of the switches 518(1) to 518(6) are to be opened or closed. For these example configurations, when the search circuit 116 uses an array of possible current amounts in which to search for and select a target current amount, each element in the array may be one of the n-bit digital values. As an example with reference to the six current source circuit configuration of FIG. 5 where the n-bit digital value is a 6-bit value, the minimum current value of the array may be "000000" corresponding to all of the switches 518(1) to 518(6) being open, the maximum current value in the array may be "111111" corresponding to all of the switches 518(1) to 518(6) being closed, and the middle current amount may be "100000" corresponding to the sixth switch 518(6) being closed and the remainder of the switches 518(1) to 518(5) being open so that the control current Ictrl is the sixth current I6. As the duty cycle correction process iterates through the six iterations, the search circuit 116 establishes new available portions within the array and selects new 6-bit values in the new available portions, until it selects a last 6-bit value in a last new available portion during a last iteration.

Figure 6:
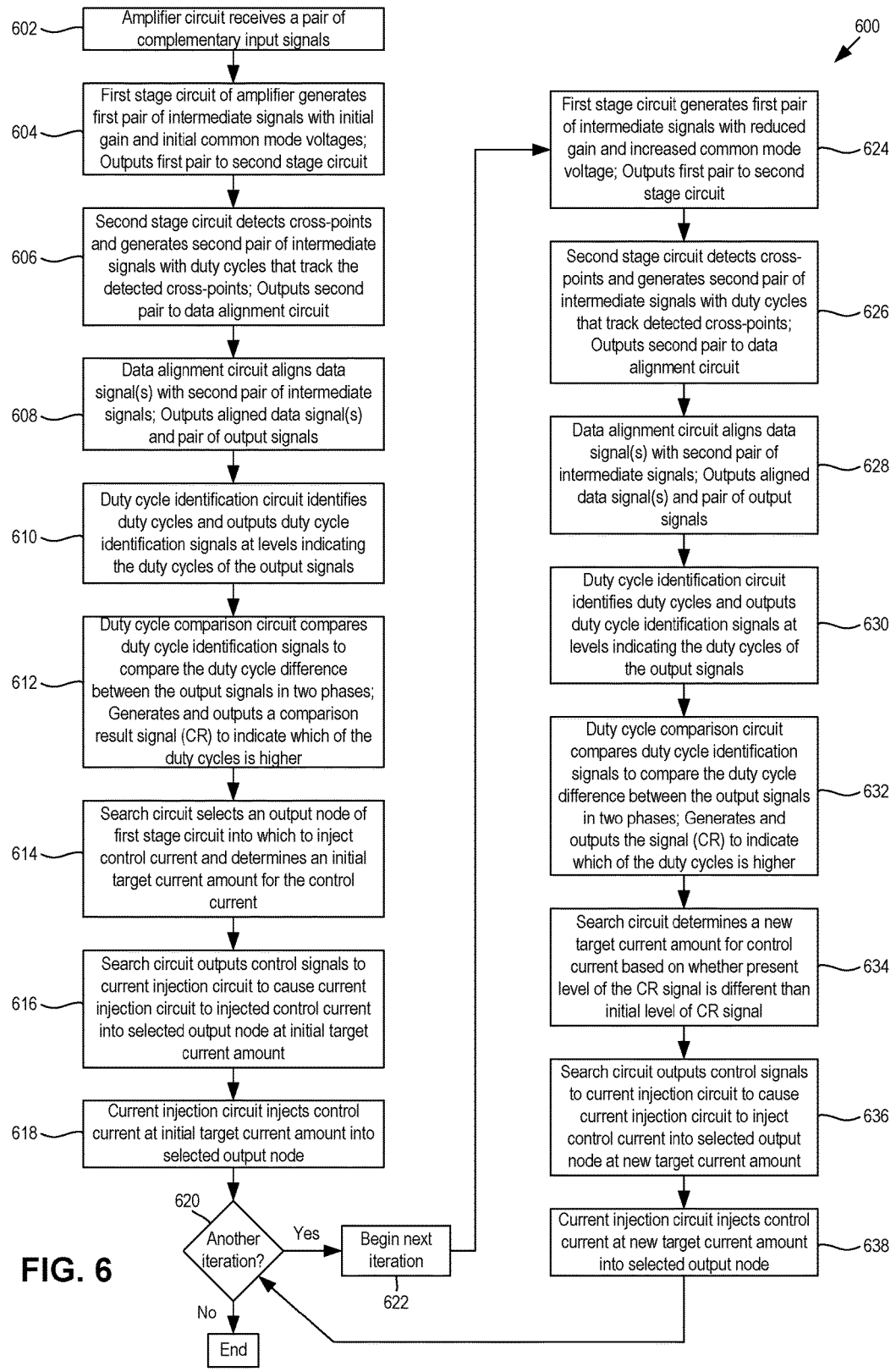
FIG. 6 is a flow chart of an example method of performing a duty cycle correction process.

FIG. 6 is a flow chart of an example method 600 of performing a duty cycle correction process. The example method 600 may be performed with the example duty cycle correction circuit 100 as described with reference to FIGS. 1-5. At block 602, during a first iteration of the duty cycle correction process, an amplifier circuit, such as the amplifier circuit 104, may receive a pair of complementary pair of input signals REnx, BREnx. At block 604, a first stage circuit of the amplifier circuit, such as the first stage circuit 120 of FIGS. 1 and 5, may be configured to amplify the pair of input signals REnx, BREnx with an initial amount of gain to generate a first pair of complementary intermediate signals REAMP, BREAMP. Each of the first pair of intermediate signals REAMP, BREAMP may have respective common mode voltages CM_R, CM_BR, which may initially be the same. In addition, the first stage circuit may generate the first pair of intermediate signals REAMP, BREAMP at a pair of output nodes, such as output nodes A and B, and output the first pair of intermediate signals REAMP, BREAMP to a second stage circuit of the amplifier circuit, such as the second stage circuit 122 of FIGS. 1 and 5.

At block 606, the second stage circuit may detect cross-points of the first pair of intermediate signals REAMP, BREAMP. In response to the detection, the second stage circuit generates a second pair of complementary intermediate signals REx, BREx by transitioning levels of the second pair REx, BREx between high and low levels. Accordingly, the duty cycles of the intermediate signals of the second pair REx, BREx correspond to the cross-points of the intermediate signals of the first pair REAMP, BREAMP. The second stage circuit may output the second pair of intermediate signals REx, BREx to a data alignment circuit, such as the data alignment circuit 106 of FIG. 1.

At block 608, the data alignment circuit may receive the second pair of intermediate signals REx, BREx as well as one or more data signals. In response, the data alignment circuit may align the data signal so that rising and falling edges of data pulses occur at certain times or with a certain amount of phase delay relative to the rising and falling edges of the second pair of intermediate signals REx, BREx. Upon aligning the data signals to the rising and falling edges of the second pair of intermediate signals REx, BREx, the data alignment circuit may output one or more aligned data signals and a pair of complementary output signals DQS, BDQS corresponding to the second pair of intermediate signals REx, BREx.

At block 610, a duty cycle identification circuit of a controller, such as the duty cycle identification circuit 108 of the controller 102 of FIG. 1, may receive the pair of output signals DQS, BDQS output from the data alignment circuit. In response, the duty cycle identification circuit may identify the duty cycles of each of the output signals DQS, BDQS and, in turn, generate and output a first duty cycle identification signal D_ID at a level that indicates a duty cycle of a first output signal DQS of the pair of output signals, and generate and output a second duty cycle identification signal BD_ID at a level that indicates a duty cycle of a second output signal BDQS of the pair of output signals. The duty cycle identification circuit may output the pair of duty cycle identification signals D_ID, BD_ID to a duty cycle comparison circuit of the controller, such as the duty cycle comparison circuit 114 of FIGS. 1 and 2.

At block 612, the duty cycle comparison circuit may compare the duty cycles of the pair of output signals DQS, BDQS by comparing the levels of the duty cycle identification signals D_ID, BD_ID. In some example methods, the duty cycle comparison circuit may be configured to compare the duty cycles over two phases. In a first phase, a differential amplifier, such as the differential amplifier 202 of FIG. 2, may be configured to first receive the second duty cycle identification signal BD_ID at its positive input terminal, generate an output signal AMPOUT at a voltage level corresponding to the level of the second duty cycle identification signal BD_ID, and feed back the output signal AMPOUT to its negative input terminal so that a voltage corresponding to a level of the second duty cycle identification signal BD_ID is generated at the negative input terminal. A capacitor, such as the capacitor C1 in FIG. 2, may be configured to maintain the voltage level at the negative input terminal for the start of a second phase. In the second phase, the positive input terminal may be configured to receive the first duty cycle identification signal D_ID. In response, the differential comparator may be configured to compare the level of the first duty cycle identification signal D_ID with the level of the second duty cycle identification signal BD_ID, and generate and output the output signal AMPOUT at a voltage level indicative of the difference between the two levels.

As previously described, in the event that the differential amplifier has an offset voltage at the input terminals, that offset voltage may be part of the voltage that is generated at the negative input terminal during the first phase, and the offset voltage may again be part of the voltage that is generated at the positive input terminal during the second phase. Accordingly, when the differential circuit generates its output signal AMPOUT during the second phase, the offset voltage is cancelled out and does not undesirably affect the voltage level of the output signal AMPOUT. This way, even if the differential amplifier has an offset voltage at its input terminals, the differential amplifier is still able to generate its output signal AMPOUT at a voltage level during the second phase that accurately indicates the difference between the level of the first duty cycle identification D_ID and the level of the second duty cycle identification signal BD_ID, and in turn, accurately indicates the difference between the duty cycle of the first output signal DQS and the duty cycle of the second output signal BDQS.

The duty cycle comparison circuit may further include a comparator circuit, such as the comparator circuit 204 of FIG. 2, that is configured to generate a comparison result signal CR in response to receipt of the output signal AMPOUT of the differential amplifier and a reference voltage. If, during the second phase, the first duty cycle identification signal D_ID is higher than the second duty cycle identification signal BD_ID, then the differential amplifier may output its output signal AMPOUT at a voltage level that causes the comparator circuit to output the comparison result signal CR at a high voltage level, indicating that the duty cycle of the first output signal DQS is higher than the duty cycle of the second output signal BDQS. Alternatively, if during the second phase, the first duty cycle identification signal D_ID is lower than the second duty cycle identification signal BD_ID, then the differential amplifier may output its output signal AMPOUT at a voltage level that causes the comparator circuit to output the comparison result signal CR at a low voltage level, indicating that the duty cycle of the first output signal DQS is lower than the duty cycle of the second output signal BDQS. The comparator circuit may output the comparison result signal CR to a search circuit, such as the search circuit 116 of FIG. 1.

At block 614, the search circuit may receive the comparison result signal CR, and in response, identify whether the comparison result signal CR is at the high level or the low level. During the first iteration, the search circuit may identify the level of the comparison result signal as an initial level that indicates which of the two duty cycles of the output signals DQS, BDQS is initially higher than the other before any duty cycle correction is performed. In response to identifying that the comparison result signal CR is at the high level, the search circuit may determine to inject a control current Ictrl into output node B to reduce a gain and increase a common mode voltage CM_BR of the second intermediate signal of the first pair BREAMP. Alternatively, in response to identifying that the comparison result signal CR is at the low level, the search circuit may determine to inject the control current Ictrl into output node B to reduce the a gain and increase a common mode voltage CM_R of the first intermediate signal of the first pair REAMP.

In addition, at block 614, the search circuit may determine an initial target current amount of the control current Ictrl. In some example methods, the search circuit may select the initial current amount from an array or list of possible current amounts, as previously described. The initial target current amount may be a middle element in the array. The search circuit may select the middle element of the array for the initial target current amount as part of executing a search algorithm, such as a binary search algorithm, as previously described. Also, as previously described, where the search circuit executes the binary search algorithm to search for and identify target current amounts, the array may define an initial present available portion from which the search circuit can select target current amounts for the control current Ictrl. In some example methods, the elements in the array are n-bit binary numbers that each represent a unique current amount for the control current Ictrl and also a unique combination of switches in a set included in a current generation circuit, such as the switches 518(1) to 518(6) of the current generation circuit 510 of the current injection circuit 118 of FIG. 5, that are to be activated to generate the unique current amount. The search circuit may identify which of the switches in the set are to be activated and which are to be deactivated in response to identifying the binary value of the binary number it selects and/or the logic values of the individual bits of the binary number, as previously described.

At block 616, the search circuit may output control signals ENBP, ENBM to switches of a current injection circuit, such as switches 514 and 516 of the current injection circuit 118 of FIG. 5, at appropriate levels to control whether the control current injection circuit injects the current Ictrl into output node A or output node B. In addition, the search circuit may output a set of control signals CC to the set of switches at appropriate levels to cause the current generation circuit to generate and output the control current Ictrl at the initial target current amount. At block 618, the current injection circuit may inject the control current Ictrl at the initial target current amount to either output node A or output node B of the first stage circuit.

At block 620, the search circuit may determine if there is another iteration of the duty cycle correction process to be performed. If so, then at block 622, the next iteration of the duty cycle correction process may begin. If not, then the search circuit may determine not to search for anymore current amounts for the control current Ictrl and the duty cycle correction process may end. Upon completion of the duty cycle correction process, the search circuit may continue to output its control signals to the current injection circuit at the levels determined in the last iteration and/or the current injection circuit may continue to inject the control current Ictrl into the selected output node at the last target current amount determined by the search circuit in the last iteration. This way, the data alignment circuit may continue to output the complementary output signals DQS, BDQS with the corrected for and/or optimized for duty cycles after the duty cycle correction process is complete.

At block 624, the first stage circuit may receive the control current Ictrl at either output node A or output node B. In response to the control current Ictrl being injected into output node B, the first stage circuit may generate the second intermediate signal of the first pair BREAMP with a reduced amount of gain and an increased a common mode voltage CM_BR of the second intermediate signal of the first pair BREAMP that is proportional to the amount of the control current Ictrl. Alternatively, in response to the control current Ictrl being injected into output node A, the first stage circuit may generate the first intermediate signal of the first pair REAMP with a reduced amount of gain and an increased a common mode voltage CM_R of the first intermediate signal of the first pair REAMP that is proportional to the amount of the control current Ictrl. Reducing the gain of one of the intermediate signals may, in turn, reduce the differential gain of the first pair of intermediate signals. The first stage circuit may output the first set of intermediate signals with the reduced gain and the increased common mode voltage to the second stage circuit.

At block 626, the second stage circuit may detect cross-points of the first pair of intermediate signals REAMP, BREAMP, and generate the second pair of intermediate signals REx, BREx with duty cycles that correspond to and/or track the detected cross-points. The injection of the control current Ictrl into output node A or output node B may cause the cross-points to occur in more equally-spaced intervals and in turn the duty cycles to be more closely matched. The second stage circuit may output the second pair of intermediate signals REx, BREx to the data alignment circuit.

At block 628, the data alignment circuit may align the data signal(s) to the rising and falling edges of the second pair of intermediate signals REx, BREx and output the aligned data signal(s) and the pair of output signals DQS, BDQS, as previously described. At block 630, the duty cycle identification circuit may receive the pair of output signals DQS, BDQS, and in response, generate and output the first and second duty cycle identification signals D_ID, BD_ID at levels indicating the duty cycles of the first and second output signals DQS, BDQS, respectively, as previously described. At block 632, the duty cycle comparison circuit may compare the duty cycles of the pair of output signals DQS, BDQS in two phases, and in turn, output the comparison result signal CR at a high level to indicate that the first output signal DQS has a higher duty cycle than the second output signal BDQS, or at a low level to indicate that the second output signal BDQS has a higher duty cycle than the first output signal DQS, as previously described.

At block 634, the search circuit may receive the comparison result signal CR, and in response, identify whether the present level of the comparison result signal CR is at the high level or the low level. Additionally, at block 634, the search circuit may determine whether the present level has changed or is different from the initial level determined in the first iteration. In response to identifying that the present level has not changed, the search circuit may determine to increase the amount of the control current Ictrl and/or select a new target current amount for the control current Ictrl that is higher than the present target current amount at which the control current Ictrl is being injected. Alternatively, in response to identifying that the present level has changed from its initial level, the search circuit may determine to decrease the amount of the control current Ictrl and/or select a new target current amount for the control current Ictrl that is lower than the present target current amount at which the control current Ictrl is being injected.

For some example methods, the search circuit may select new target current amount from an array of current amounts. For example, if the search circuit determines to increase the amount of the control current Ictrl, the search circuit may select a current amount in the array that is higher than the present target current amount. Alternatively, if the search circuit determines to decrease the amount of the control current Ictrl, the search circuit may select a current amount in the array that is lower than the present target current amount. In addition or alternatively, for example methods where the elements in the array are n-bit binary numbers representing the current amounts, the selection circuit may select a binary number corresponding to the new target current amount it wants to inject. In some example methods, the search circuit may select a higher binary number from the array to increase the amount of the control current Ictrl and select a lower binary number from the array to decrease the control current Ictrl. In other example methods, the search circuit may select a lower binary number from the array to increase the amount of the control current Ictrl and select a higher binary number from the array to decrease the amount of the control current Ictrl. Various ways of selecting a binary number from an array to have the control current Ictrl output at a selected or desired current amount is possible. In addition or alternatively, the search circuit may execute a search algorithm, such as a binary search algorithm, to search for and/or select target current amounts from the array in response to the level of the comparison result signal CR, as previously described.

At block 636, the search circuit may set the control signals CC to levels corresponding to the new target current amount, which may include adjusting one or more of the levels of the control signals CC so that a different combination of the set of switches of the current generation circuit is activated to generate the control current Ictrl at the new target current amount. At block 638, the current injection circuit may inject the control current Ictrl at the new target current amount to the selected output node A or B of the first stage circuit.

The example method 600 may then proceed back to block 620, where the search circuit may determine if there is another iteration of the duty cycle correction process to be performed. If so, then the method 600 may begin the next iteration at block 622. If not, then the duty cycle correction process may end.

Figure 7:
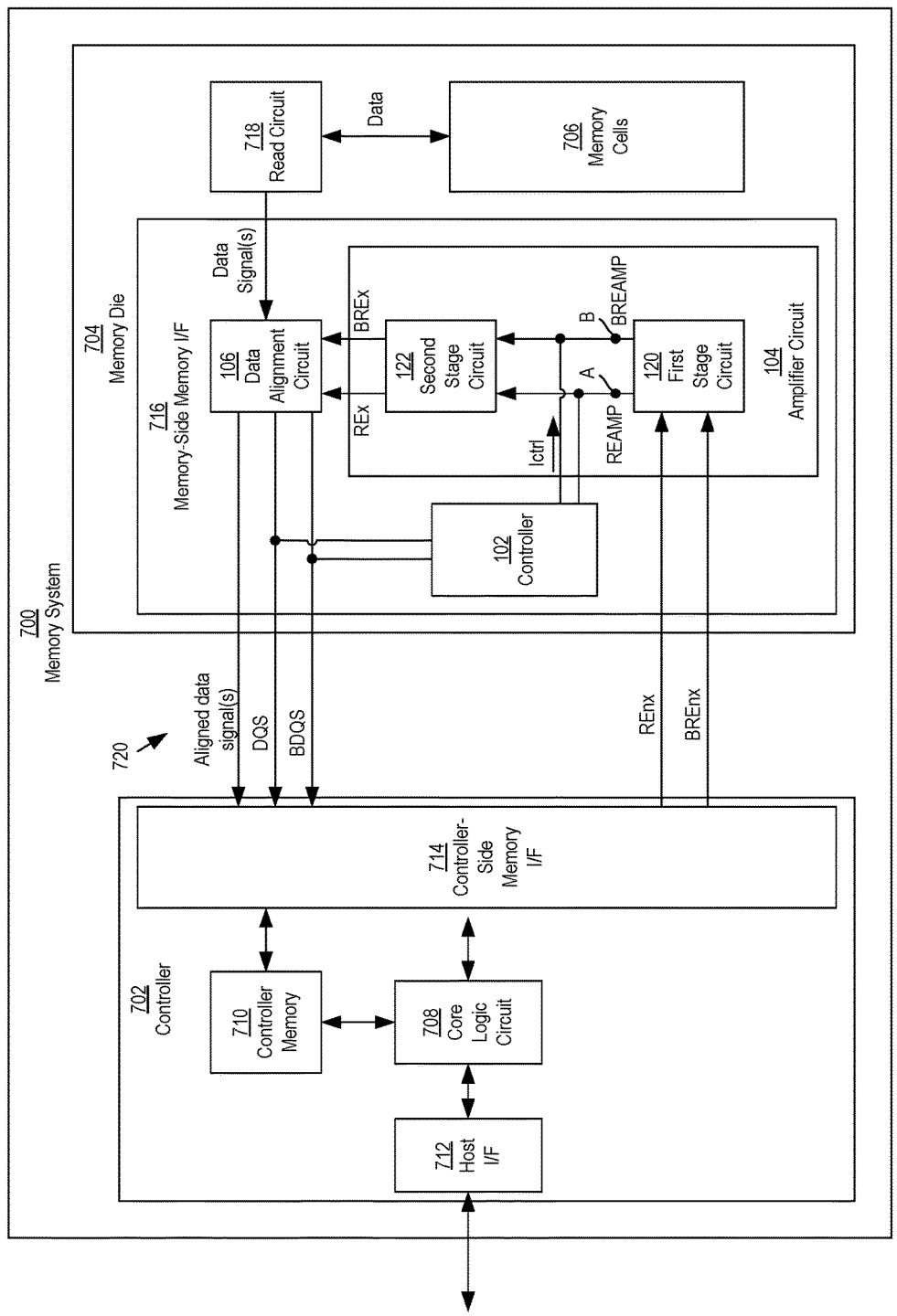
FIG. 7 is a block diagram of an example memory system configured with the example duty cycle correction circuit of FIG. 1.

FIG. 7 shows a block diagram of an example memory system 700 that may include the duty cycle correction circuit 100 as shown and described with reference to FIGS. 1-5 and that may be configured to perform the example duty cycle correction method 600 of FIG. 6. The memory system 700 may be configured to be connected to and/or in communication with a host system (not shown). The host system may be any electronic system or device that is configured to communicate and/or operate with the memory system 700.

The memory system 700 may include a controller 702 and a memory die 704. The memory die 704 may include memory cells or elements 706, with each memory cell or element being configured to store one or more bits data. Any suitable type of memory cells can be used. As examples, the memory cells may be volatile memory such as dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory may have different configurations. For example, flash memory may be configured in a NAND or a NOR configuration.

The memory cells can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

The controller 702 may include a core logic circuit 708. The core logic circuit 708 may be configured to perform memory management functions, non-limiting examples of which may include, but not limited to, communicating with the host system, including receiving, handling, and responding to host requests or commands, such as read, write, erase, and status requests/commands received from the host system; error detection and correction (which may be part of handling host requests/commands); formatting the memory cells 706 to ensure it is operating properly; mapping out bad memory cells; allocating spare cells to be substituted for future failed cells; wear leveling (distributing writes to avoid wearing out specific blocks of memory that would otherwise be repeatedly written to); garbage collection (after a block is full, moving only the valid pages of data to a new block, so the full block can be erased and reused); folding operations (moving data from a lower density memory area to a higher density memory area of the memory 706); and transitioning the memory system 700 between different states, operation modes, and/or power consumption modes. In operation, when the host system needs to read data from or write data to the memory 706, it may communicate with the core logic circuit 708. The core logic circuit 708 may include hardware or a combination of hardware and software. For example, the core logic circuit 708 may include a central processing unit, an application specific integrated circuit (ASIC), a field programmable gate array (FPGA), a digital logic circuit, an analog circuit, a combination of discrete circuits, gates, or any other type of hardware, or a combination thereof.

The controller 702 may also include controller memory 710, which may include volatile memory (e.g., random access memory (RAM)), non-volatile memory (e.g., read-only memory (ROM)), or a combination thereof. The controller memory 710 may store software or firmware instructions and/or certain data structures, such as address translation data structures, that the core logic circuit 708 may access and/or and execute to perform at least some of its memory management functions. Additionally, the core logic circuit 708 may temporarily store data that is to be transferred to and stored in the memory cells 706 such as in response to a host write command, and/or that was retrieved from the memory cells 706 and is to be sent to the host system, such as in response to a host read command. FIG. 7 shows the controller memory 710 as a component of the controller 702, although in other example configurations, at least some of the controller memory 710 may be a component of the memory system 700 that is separate from the controller 702. For example, the controller 702 may be an integrated circuit, and depending on the configuration of the memory system 700, the controller memory 710 may be located on the integrated circuit, partially on the integrated circuit and partially separate from the integrated, or completely separate from the integrated circuit.

The controller 702 may further include a host interface (I/F) 712. The core logic circuit 708 may be configured to communicate with a host system via a host interface 712. In addition, the controller 702 may include a controller-side memory interface (I/F) 714 through which the controller 702 is configured to communicate with the memory die 704. Similarly, the memory die 704 may include a memory-side memory interface (I/F) 716 through which the memory die 704 is configured to communicate with the controller 702. As shown in FIG. 7, the memory-side memory interface 716 may the duty cycle correction circuit 100, including the controller 102 and the amplifier circuit 104 in communication with the data alignment circuit 106.

When the controller 702 wants to read data stored in the memory cells 706, such as in response to receipt of a host read request from the host system, a read circuit 718 may be configured to retrieve the data from the memory cells 706 and output the data as one or more data signals to the data alignment circuit 106. In order for the controller 702 to know when to latch on to or sample the data pulses of the data signal(s), the controller 702 may send a pair of complementary clock signals to the memory die 704, and the memory die 704 may use the pair of complementary clock signals to align the data pulses of the data signals. The memory die 104 may then send the data aligned data signal(s) along with the complementary clock signals back to the controller 702, and the controller 702 look to the rising and falling edges of the complementary clock signals it receives to determine when to latch onto, sample, or otherwise identify the levels of the data pulses.

In a particular example configuration, and in accordance with the complementary signals that are received, generated, and output in FIGS. 1-6, when the controller 702 wants to read data from the memory cells 706, the controller-side memory interface 714 may output a complementary pair of clock signals REnx, BREnx to the memory-side memory interface 716. The clock signals REnx, BREnx may be the pair of complementary pair of input signals received by the duty cycle correction circuit 100, as previously described with reference to FIGS. 1-6. The first stage circuit 120 may be configured to amplify the clock signals REnx, BREnx to generate the first pair of intermediate clock signals REAMP, BREAMP at output nodes A and B. The second stage circuit 122 may be configured to detect the cross-points of the first pair of intermediate clock signals REAMP, BREAMP to generate the second pair of intermediate clock signals REx, BREx. The data alignment circuit 106 may use the second pair of intermediate signals REx, BREx to align the data pulses of the data signal(s) received from the read circuit 718, and output the aligned data signal(s) along with the pair of output clock signals DQS, BDQS back to the controller 702.

Ideally, the data alignment circuit 106 outputs the output clock signals DQS, BDQS with a matched, predetermined duty cycle of 50%. However, in actual implementation, the data alignment circuit 106 may output the output clock signals DQS, BDQS with some amount of duty cycle distortion. In general, the duty cycle of one of the output clock signals DQS, BDQS is higher than the other. Having too much duty cycle distortion in the output clock signals DQS, BDQS may lead to too many errors when the controller 702 is receiving the data signals. For example, too high of duty cycle distortion may cause the data pulses of the data signal(s) to not be sufficiently aligned with the pulses of the output clock signals DQS, BDQS, which in turn may cause the controller 702 to sample the level of the same data pulse twice and/or to miss sampling a data pulse. In addition or alternatively, if a clock pulse of the output clock signals DQS, BDQS is too small, sampling circuitry of the controller 702 may filter out or otherwise not recognize a falling or rising edge of the output clock signals DQS, BDQS, and in turn miss sampling a data pulse.

Two sources may be the cause of the duty cycle distortion in the output clock signals DQS, BDQS. First, the controller 702 may generate and output the initial pair of complementary clock signals REnx, BREnx with distorted duty cycles. Second, the clock path extending from the input of the amplifier stage circuit 120 to the output of the data alignment circuit 106 may distort the duty cycles. Either or both of these sources may cause the data alignment circuit 106 to output the output signals DQS, BDQS with too high of an amount of duty cycle distortion if duty cycle correction is not performed.

As shown in FIG. 7, the controller 102 of the duty cycle correction circuit 100 may be coupled to the lines on which the data alignment circuit 106 outputs the output clock signals DQS, BDQS to the controller 702, or is otherwise configured to receive the output clock signals DQS, BDQS. As previously described, the controller 102 may be configured to search for and/or select target amounts of current for a control current Ictrl and inject the control current Ictrl into either output node A or output node B of the first stage circuit 120. As previously described, by injecting the control current Ictrl at an optimum amount into the first stage circuit 120, the duty cycles of the output signals DQS, BDQS can be or, at least moved closer to, the predetermined duty cycle of 50%, which in turn may lead to higher signal integrity and a reduced amount of errors when the controller 702 and the memory die 704 communicate to read data from the memory cells 706. This may be of particular benefit as the speed or data rate requirements for which the controller 702 and the memory die 704 communicate increases, such as into the Gigahertz range, because higher frequencies may cause larger amounts of duty cycle distortion.

In addition, the duty cycle correction circuit 100 may be advantageous over other duty cycle correction topologies that utilize a delay chain of delay cells in that the duty cycle correction circuit 100 may be able to correct for a larger amount of duty cycle distortion while taking up less physical space on a die. A successful duty cycle correction process may be able to bring the amount of duty cycle distortion to within an acceptable amount of duty cycle distortion or mismatch. Duty cycle correction topologies that utilize delay chains may be relatively limited in the amount of duty cycle distortion that they can correct. If order to increase their duty cycle correction capability, more delay cells may need to be added to the circuit, resulting in a larger amount of space that the duty cycle correction circuit consumes. In contrast, the duty cycle correction circuit 100 of the present description may be configured to correct for a large amount of duty cycle distortion without having to increase its size or the space it consumes. For example, the duty cycle correction circuit 100 may be able to correct for initial duty cycle mismatches of 60% or even higher. This may be especially beneficial as communication frequencies increase, since the increased frequencies often times result in larger amounts of duty cycle distortion.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:
1. A circuit comprising:
a complementary signal path circuit configured to receive a pair of complementary input signals and generate a pair of complementary output signals in response to receipt of the pair of complementary input signals, wherein the complementary signal path circuit comprises:
an amplifier circuit configured to receive the pair of complementary input signals and generate at least one pair of complementary intermediate signals in response to receipt of the pair of complementary input signals; and
a control circuit configured to:
measure a duty cycle mismatch between the pair of complementary output signals; and
based on the measured duty cycle mismatch, set at least one of:
a gain of the amplifier circuit, or
a high voltage level and a low voltage level to set a common mode voltage of the at least one pair of complementary intermediate signals.

2. The circuit of claim 1, wherein the control circuit is further configured to:
inject a control current into the amplifier circuit based on the duty cycle mismatch to set at least one of the gain or the common mode voltage.

3. The circuit of claim 2, wherein the at least one pair of complementary intermediate signals comprises a first pair of complementary intermediate signals and a second pair of complementary intermediate signals,
wherein the amplifier circuit comprises a first stage circuit configured to generate the first pair of complementary intermediate signals and a second stage circuit configured to generate the second pair of complementary intermediate signals, and
wherein the control circuit is configured to select one of a first output node and a second output node of the first stage circuit into which to inject the control current.

4. The circuit of claim 3, wherein the control circuit is further configured to:
determine target current amounts at which to inject the control current over an N-number of iterations; and
inject the control current at the determined target current amounts into the selected one of the first and second output nodes during the N-number of iterations.

5. The circuit of claim 3, wherein each of the complementary output signals comprises a respective duty cycle, and wherein the control circuit is further configured to:
select the one of the first and second output nodes into which to inject the control current in response to an identification of which of the duty cycles of the pair of complementary output signals is higher.

6. The circuit of claim 3, wherein the first stage circuit comprises a first branch configured to generate a first signal of the first pair of complementary intermediate signals, and a second branch configured to generate a second signal of the first pair of complementary intermediate signals, wherein the first branch is connected to the first output node and the second branch is connected to the second output node,
- wherein the control circuit is configured to inject the control current into the selected one of the first and second output nodes to cause the first branch to generate the first signal with reduced gain and an increased common mode voltage or to cause the second branch to generate the second signal with reduced gain and an increased common mode voltage.

7. The circuit of claim 3, wherein the second stage circuit is configured to:
- detect cross-points of the first pair of complementary intermediate signals in order to generate the second pair of complementary intermediate signals;
- adjust duty cycles of the second pair of complementary intermediate signals in response to a change in the cross-points corresponding to the injection of the control current; and
- output the second pair of complementary intermediate signals with the adjusted duty cycles to a data alignment circuit of the complementary signal path circuit.

8. The circuit of claim 1, wherein the control circuit comprises:
- a differential amplifier configured to:
  - in a first duty cycle comparison phase:
    - receive, at a first input terminal, a first voltage level indicative of a duty cycle of a first signal of the pair of complementary output signals;
    - generate an output voltage at a first output voltage level corresponding to the first voltage level; and
    - feed back the output voltage at the first output voltage level to a second input terminal; and
  - in a second duty cycle comparison phase:
    - receive, at the first input terminal, a second voltage level indicative of a duty cycle of a second signal of the pair of complementary output signals; and
    - generate the output voltage at a second output level indicative of a difference between the first voltage level of the first duty cycle identification signal and the second voltage level.

9. A circuit comprising:
- an amplifier circuit configured to output an amplifier output signal in response to receipt of an input signal;
- a search circuit configured to search for a target current amount for a control current; and
- a current injection circuit configured to inject the control current at the target current amount into the amplifier circuit,
- wherein the amplifier circuit is configured to adjust a duty cycle of the amplifier output signal in response to receipt of the control current at the target current amount.

10. The circuit of claim 9, wherein the search circuit is configured to select the target current amount from an array of possible target current amounts for the control current.

11. The circuit of claim 10, wherein the current injection circuit comprises a plurality of current source circuits, wherein each of the current source circuits is configured to output a respective one of a plurality of currents for generation of the control current,
- wherein the possible target current amounts in the array are represented by n-bit binary values, and,
- wherein the search circuit is configured to identify a combination of the current source circuits to be activated corresponding to logic levels of bits of the n-bit binary values.

12. The circuit of claim 9, further comprising:
- a data alignment circuit configured to output a pair of complementary output signals in response to receipt of the amplifier output signal, wherein each of the complementary output signals has a respective duty cycle,
- wherein the search circuit is configured to search for the target current amount based on which of the duty cycles of the complementary output signals is higher.

13. The circuit of claim 12, wherein the search circuit is configured to search for a plurality of target current amounts over a plurality of iterations of a duty cycle correction process, and wherein the search circuit is configured to set either a new maximum target current amount or a new minimum target current amount during each of the iterations in order to search for the plurality of target current amounts.

14. The circuit of claim 9, wherein the search circuit is configured to execute a search algorithm to search for the target current amount.

15. The circuit of claim 14, wherein the search algorithm is a binary search algorithm.

16. A system comprising:
- an amplifier circuit configured to generate at least one pair of clock signals;
- a data alignment circuit configured to generate an aligned data signal and a pair of output clock signals based on the at least one pair of clock signals; and
- a feedback circuit configured to:
  - determine duty cycle distortion in the pair of output clock signals; and
  - in response to the determination, control the amplifier circuit to adjust at least one characteristic of the at least one pair of clock signals to compensate for the duty cycle distortion.

17. The system of claim 16, wherein the feedback circuit is configured to output current to the amplifier circuit to cause the amplifier circuit to adjust the at least one characteristic.

18. The system of claim 16, wherein the feedback circuit is configured to control the amplifier circuit to adjust crosspoints of the at least one pair of clock signals.

19. The system of claim 16, wherein the feedback circuit is configured to control the amplifier circuit to move duty cycles of the pair of output clock signals closer to a predetermined duty cycle.

20. The system of claim 16, further comprising:
- a duty cycle comparison circuit configured to:
  - in a first duty cycle comparison phase:
    - receive, at a first input terminal, a first voltage level indicative of a duty cycle of a first output clock signal of the pair of output clock signals;
    - generate an output voltage at a first output voltage level corresponding to the first voltage level; and
    - feed back the output voltage at the first output voltage level to a second input terminal; and
  - in a second duty cycle comparison phase:
    - receive, at the first input terminal, a second voltage level indicative of a duty cycle of a second output clock signal of the pair of output clock signal; and
    - generate the output voltage at a second output level indicative of a difference between the duty cycle of the first output clock signal and the duty cycle of the second output clock signal.

21. A system comprising:
an amplifier circuit comprising:
  a first branch configured to:
    receive a first input signal of a pair of input signals; and
    output a first intermediate signal of a pair of intermediate signals; and
  a second branch configured to:
    receive a second input signal of the pair of input signals; and
    output a second intermediate signal of the pair of intermediate signals;
a data alignment circuit configured to generate a pair of output signals based on the pair of intermediate signals; and
a control circuit configured to:
  measure a duty cycle mismatch between the pair of output signals; and
  based on the measured duty cycle mismatch, inject a control current into:
    the first branch to generate the first intermediate signal of the pair of intermediate signals with reduced gain and an increased common mode voltage; or
    the second branch to generate the second intermediate signal of the pair of intermediate signals with reduced gain and an increased common mode voltage.

* * * * *